(12) United States Patent
Hayoz et al.

(10) Patent No.: US 9,276,215 B2
(45) Date of Patent: Mar. 1, 2016

(54) DIKETOPYRROLOPYRROLE POLYMERS FOR USE IN ORGANIC SEMICONDUCTOR DEVICES

(71) Applicant: BASF SE, Ludwigshafen (DE)

(72) Inventors: Pascal Hayoz, Hofstetten (CH); Patrice Bujard, Courtepin (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/362,500

(22) PCT Filed: Dec. 3, 2012

(86) PCT No.: PCT/EP2012/074191
§ 371 (c)(1),
(2) Date: Jun. 3, 2014

(87) PCT Pub. No.: WO2013/083506
PCT Pub. Date: Jun. 13, 2013

(65) Prior Publication Data
US 2014/0332730 A1    Nov. 13, 2014

Related U.S. Application Data

(60) Provisional application No. 61/567,651, filed on Dec. 7, 2011.

(30) Foreign Application Priority Data

Dec. 7, 2011   (EP) ................................. 11192316

(51) Int. Cl.
| | | |
|---|---|---|
| C08G 75/00 | (2006.01) | |
| H01L 51/00 | (2006.01) | |
| C09B 57/00 | (2006.01) | |
| C09B 69/10 | (2006.01) | |
| H01L 51/05 | (2006.01) | |

(52) U.S. Cl.
CPC .......... *H01L 51/0043* (2013.01); *C09B 57/004* (2013.01); *C09B 69/109* (2013.01); *H01L 51/0003* (2013.01); *H01L 51/0036* (2013.01); *H01L 51/0541* (2013.01); *Y02E 10/549* (2013.01)

(58) Field of Classification Search
CPC .................................................... C09B 57/004
USPC ........... 257/40, E51.012; 427/331; 528/367.8
See application file for complete search history.

(56) References Cited

U.S. PATENT DOCUMENTS

| | | | |
|---|---|---|---|
| 6,451,459 | B1 | 9/2002 | Tieke et al. |
| 6,690,029 | B1 | 2/2004 | Anthony et al. |
| 2003/0021913 | A1 | 1/2003 | O'Neill et al. |
| 2006/0013549 | A1 | 1/2006 | Shtein et al. |
| 2007/0079867 | A1 | 4/2007 | Chittibabu et al. |
| 2011/0240981 | A1 * | 10/2011 | Duggeli et al. ................ 257/40 |
| 2011/0284826 | A1 | 11/2011 | Hayoz et al. |
| 2012/0142872 | A1 | 6/2012 | Lamatsch et al. |
| 2014/0128618 | A1 | 5/2014 | Hayoz et al. |

FOREIGN PATENT DOCUMENTS

| | | |
|---|---|---|
| EP | 2 034 537 A2 | 3/2009 |
| EP | 2 075 274 A1 | 7/2009 |
| WO | WO 03/052841 A1 | 6/2003 |
| WO | WO 2004/112161 A2 | 12/2004 |
| WO | WO 2005/049695 A1 | 6/2005 |
| WO | WO 2007/082584 A1 | 7/2007 |
| WO | WO 2007/113107 A1 | 10/2007 |
| WO | WO 2008/000664 A1 | 1/2008 |
| WO | WO 2008/001123 A1 | 1/2008 |
| WO | WO 2008/107089 A1 | 9/2008 |
| WO | WO 2009/047104 A2 | 4/2009 |
| WO | WO 2010/049321 A1 | 5/2010 |
| WO | WO 2010/049323 A1 | 5/2010 |
| WO | WO 2010/108873 A1 | 9/2010 |
| WO | WO 2010/115767 A1 | 10/2010 |
| WO | WO 2010/135723 A2 | 11/2010 |
| WO | WO 2010/136352 A1 | 12/2010 |
| WO | WO 2011/144566 A2 | 11/2011 |
| WO | WO 2012/041849 A1 | 4/2012 |

OTHER PUBLICATIONS

U.S. Appl. No. 14/385,696, filed Sep. 16, 2014, Welker, et al.
U.S. Appl. No. 14/386,123, filed Sep. 18, 2014, Hayoz.
International Search Report issued Feb. 15, 2013 in PCT/EP2012/074191.
Alexander J. C. Kuehne, et al., "Novel vinyl ether functionalized fluorene polymers for active incorporation into common photoresist matrices", Tetrahedron Letters, vol. 49, 2008, pp. 4722-4724.
Kai Zhang, et al., "Highly luminescent polymers containing the 2,3,5,6,-tetraarylated pyrrolo[3,4-c]pyrrole-1,4-dione (N-Aryl DPP) chromophore in the main chain", Macromolecules, vol. 41, No. 20, 2008 pp. 7287-7295.
Y. Zhu, et al., "Highly luminescent 1,4-diketo-3,6-diphenylpyrrolo[3,4- c]pyrrole-(DPP-) based conjugated polymers prepared upon Suzuki coupling", Macromolecules, vol. 40, No. 19, 2007, pp. 6981-6989.

* cited by examiner

*Primary Examiner* — Shane Fang
(74) *Attorney, Agent, or Firm* — Oblon, McClelland, Maier & Neustadt, L.L.P.

(57) ABSTRACT

The present invention relates to polymers (I), or (II), and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

$$*\!-\!\!\left[\!A\!-\!D\!\right]_{\overline{x}}\!\!\left[\!A\!-\!E\!\right]_{\overline{y}}\!-\!*  \quad (I)$$

$$*\!-\!\!\left[\!A\!-\!D\!\right]_{\overline{r}}\!\!\left[\!B\!-\!D\!\right]_{\overline{s}}\!\!\left[\!A\!-\!E\!\right]_{\overline{t}}\!\!\left[\!B\!-\!E\!\right]_{\overline{u}}\!-  \quad (II)$$

17 Claims, No Drawings

DIKETOPYRROLOPYRROLE POLYMERS FOR USE IN ORGANIC SEMICONDUCTOR DEVICES

CROSS-REFERENCE TO RELATED APPLICATIONS

This application is a National Stage of PCT/EP2012/074191 filed on Dec. 3, 2012, which claims the benefit of priority to U.S. Provisional Application No. 61/567,651 filed on Dec. 7, 2011. This application is based upon and also claims the benefit of priority to European Application No. 11192316.5 filed on Dec. 7, 2011.

The present invention relates to polymers

(I)

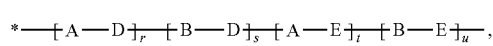

(II)

and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

U.S. Pat. No. 6,451,459 describes diketopyrrolopyrrole based polymers and copolymers comprising the following units

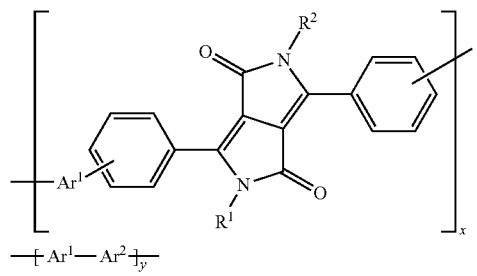

wherein x is chosen in the range of from 0.005 to 1, preferably from 0.01 to 1, and y from 0.995 to 0, preferably 0.99 to 0, and wherein x+y=1, and wherein $Ar^1$ and $Ar^2$ independently from each other stand for

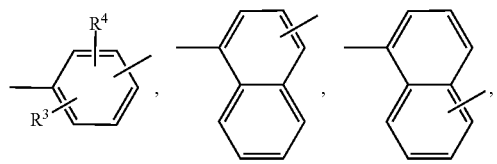

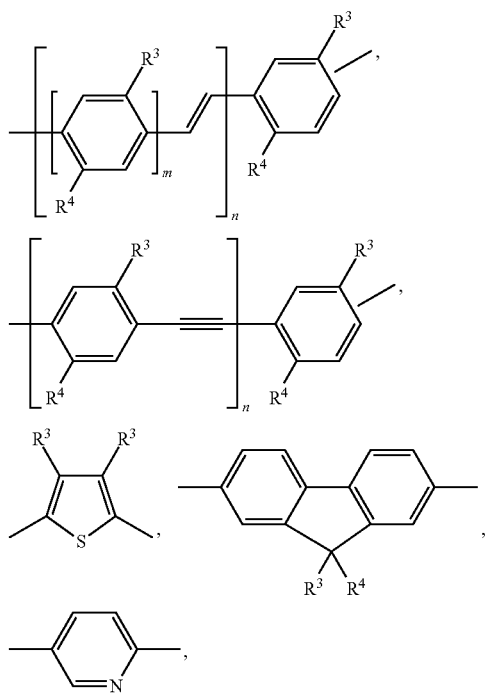

and m, n being numbers from 1 to 10, and $R^1$ and $R^2$ independently from each other stand for H, $C_1$-$C_{18}$alkyl, —C(O)O—$C_1$-$C_{18}$alkyl, perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, $R^3$ and $R^4$ preferably stand for hydrogen, $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl or perfluoro-$C_1$-$C_{12}$alkyl, and $R^5$ preferably stands for $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, or perfluoro-$C_1$-$C_{12}$alkyl, and their use in EL devices.

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose the specific DPP based polymers of formula I.

A preferred polymer comprises a repeating unit of formula

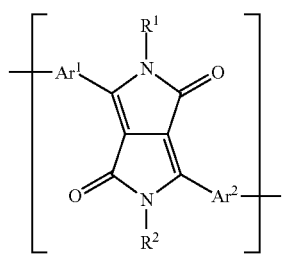

and a repeating unit

—[Ar³]—, wherein R¹ and R² are independently of each other a $C_1$-$C_{25}$alkyl group, especially a $C_4$-$C_{12}$alkyl group, which can be interrupted by one or more oxygen atoms, and Ar¹ and Ar² are independently of each other a group of formula wherein —Ar³— is a group of formula

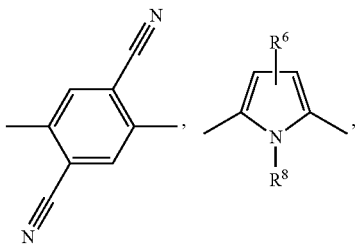

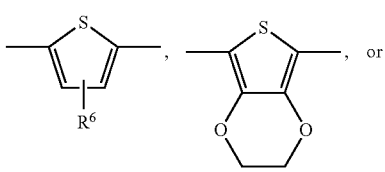

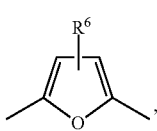

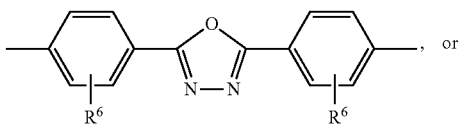

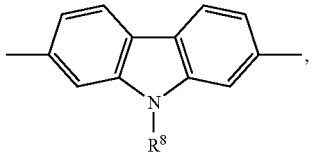

wherein
$R^6$ is hydrogen, $C_1$-$C_{18}$alkyl, or $C_1$-$C_{18}$alkoxy, and $R^{32}$ is methyl, Cl, or OMe, and $R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—.

WO08/000,664 describes polymers comprising (repeating) unit(s) of the formula

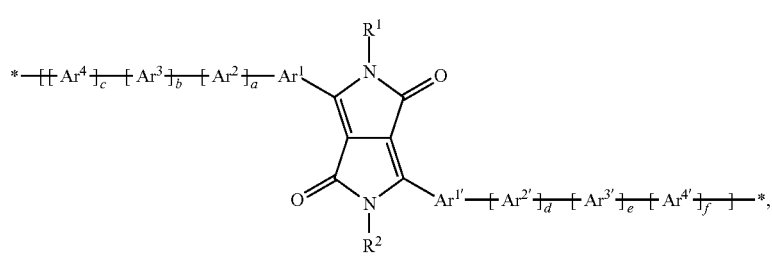

(I)

In a preferred embodiment WO08/000,664 is directed to polymers of formula

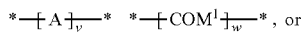 (VIIa)

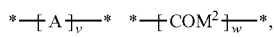 (VIIb)

wherein A is as defined above and —COM$^1$- is selected from repeating units of formula:

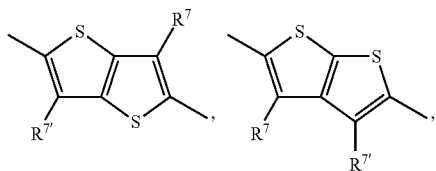

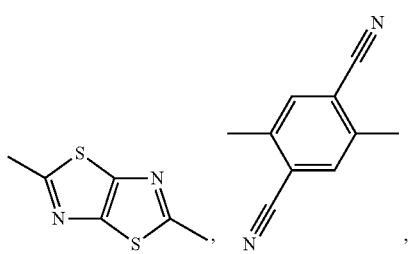

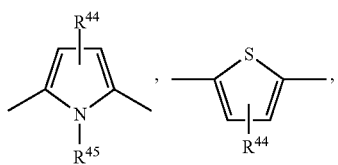

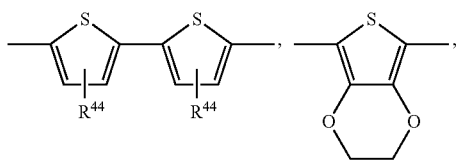

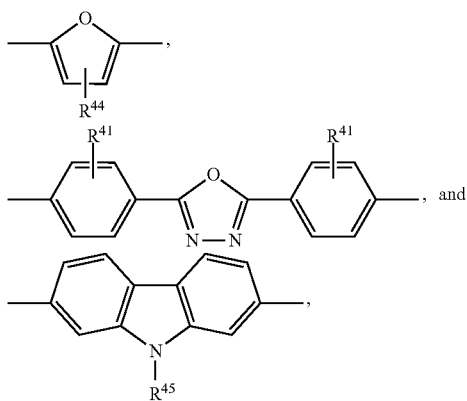

wherein R$^7$ and R$^{7'}$ are . . . , R$^{44}$ and R$^{41}$ are hydrogen, C$_1$-C$_{18}$alkyl, or C$_1$-C$_{18}$alkoxy, and R$^{45}$ is H, C$_1$-C$_{18}$alkyl, or C$_1$-C$_{18}$alkyl which is substituted by E and/or interrupted by D, especially C$_1$-C$_{18}$alkyl which is interrupted by —O—, wherein D and E are . . . , and —COM$^2$- is a group of formula

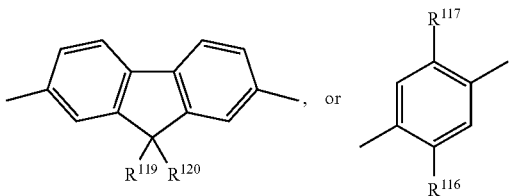

wherein

R$^{116}$ and R$^{117}$ are independently of each other H, C$_1$-C$_{18}$alkyl, which can optionally be interrupted by O, or C$_1$-C$_{18}$alkoxy, which can optionally be interrupted by O, R$^{119}$ and R$^{120}$ are independently of each other H, C$_1$-C$_{18}$alkyl, which can optionally be interrupted by O, or R$^{119}$ and R$^{120}$ together form a group of formula =CR$^{100}$R$^{101}$, wherein R$^{100}$ and R$^{101}$ are independently of each other H, C$_1$-C$_{18}$alkyl, or R$^{119}$ and R$^{120}$ together form a five or six membered ring, which optionally can be substituted by C$_1$-C$_{18}$alkyl.

Y. Zhu et al., Macromolecules 40 (2007) 6981-6989 describes five new soluble conjugated polymers, which were prepared upon Suzuki polycondensation reactions. The polymers were prepared from 1,4-diketo-2,5-dihexyl-3,6-bis(4-bromophenyl)pyrrolo[3,4-c]pyrrole (1a), 1,4-diketo-2,5-di-(2-ethylhexyl)-3,6-bis(4-bromophenyl)pyrrolo[3,4-c] pyrrole (1b), or 1,4-diketo-2,5-dihexyl-3,6-bis(4-(4,4,5,5-tetramethyl-1,3,2-dioxaborolan-2-yl)phenyl)pyrrolo[3,4-c] pyrrole (1c), and 3,6-bis(4,4,5,5-tetramethyl-1,3,2-dioxaborolan-2-yl)-9-ethylhexylcarbazole (2), 4,4'-dibromotriphenylamine (3), 4,4'-bis(4,4,5,5-tetramethyl-1,3,2-dioxaborolan-2-yl)triphenylamine (4), 2,7-bis(4,4,5,5-tetramethyl-1,3,2-dioxaborolan-2-yl)-9,9-dihexylfluorene (5), 9,10-anthracenebispinacolatoboron ester (6), and 4,7-dibromo-2,1,3-benzothiadiazole (7). The polymers exhibit brilliant red colors. Polymer solutions are highly fluorescent with photoemission maxima between 552 and 600 nm.

K. Zhang et al., Makcromolecules 41 (2008) 7287-7295 describes the synthesis and characteristic properties of polymers P-1-P-3 containing the 2,3,5,6-tetraarylated pyrrolo[3,4-c]pyrrole-1,4-dione unit in the main chain. P-1 is prepared from 2,5-bis(4-t-butylphenyl)-3,6-bis(4'-bromophenyl)pyrrolo[3,4-c]pyrrole-1,4-dione (DPP1) and 9,9-di-n-hexylfluorene-2,7'-bispinacolatoboronester 3, P-2 from 2,5-bis(4'-bromo-phenyl)-3,6-bis(4-t-butylphenyl)pyrrolo[3,4-c]pyrrole-1,4-dione (DPP2) and 3, and P-3 from DPP1, 3, and 2,5-bis(n-hexyloxybenzene)-1,4-bispinacolatoboronester 4 via Pd-catalyzed Suzuki coupling. Molecular weights of the polymers are about 8000-10 000 Da.

A. Kuehne et al., Tetrahedron Letters 49 (2008) 4722-4724 discloses the synthesis of the following polymer

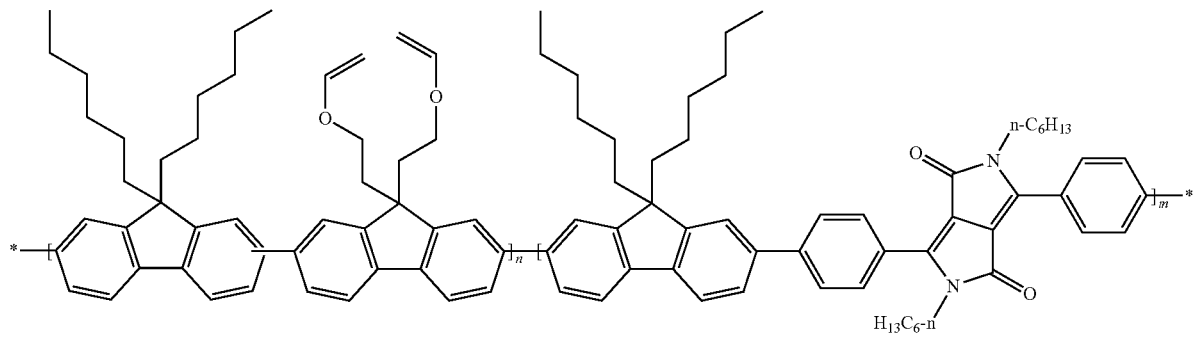

by Suzuki coupling. The vinyl ether functionality allows for active incorporation of the light emitting polymers into standard vinyl ether and glycidyl ether photoresist materials.

EP2034537A2 is directed to a thin film transistor device comprising a semiconductor layer, the semiconductor layer comprising a compound comprising a chemical structure represented by:

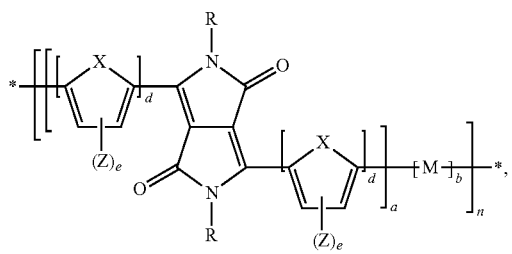

wherein each X is independently selected from S, Se, O, and NR", each R" is independently selected from hydrogen, an optionally substituted hydrocarbon, and a hetero-containing group, each Z is independently one of an optionally substituted hydrocarbon, a hetero-containing group, and a halogen, d is a number which is at least 1, e is a number from zero to 2; a represents a number that is at least 1; b represents a number from 0 to 20; and
n represents a number that is at least 1.

EP2075274A1 discloses a soluble polythiophene derivative containing highly coplanar repeating units. The coplanar characteristic of the TPT (thiophene-phenylene-thiophene) units improves the degree of intramolecular conjugation and intermolecular π-π interaction.

WO2010/049321 discloses polymers comprising one or more (repeating) unit(s) of the formula

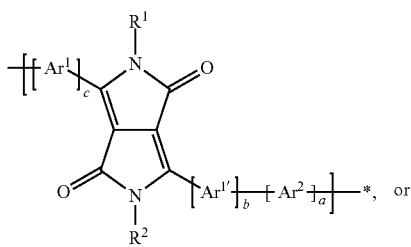

-continued

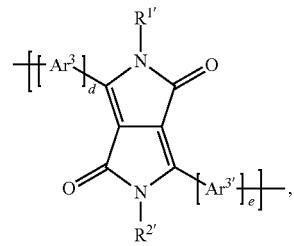

wherein
$Ar^1$, $Ar^{1'}$, $Ar^3$ and $Ar^{3'}$ are independently of each other a group of formula

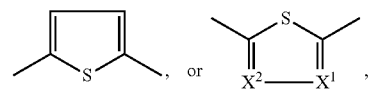

$Ar^2$ is a group of formula

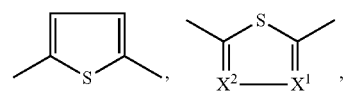

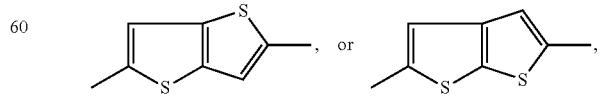

one of $X^1$ and $X^2$ is N and the other is CH, and their use as organic semiconductor in organic devices.

In Example 4 of WO2010/049321 the preparation of the following polymer is described:

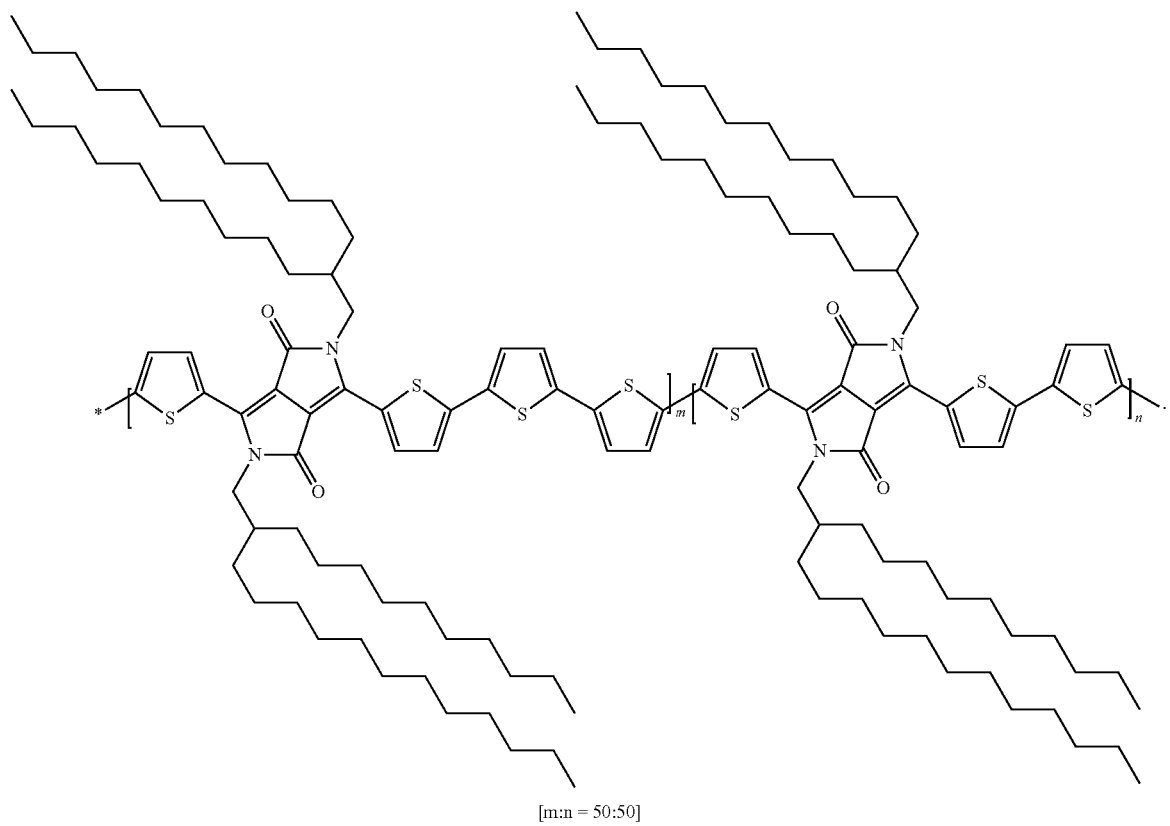

[m:n = 50:50]

WO2010/049323 relates to polymers comprising one or more (repeating) unit(s) of the formula ─[A-D]─, and at least one (repeating) unit(s) which is selected from repeating units of the formula ─[B-D]─, ─[A-E]─, and ─[B-E]─; and polymers of the formula III, or IV and their use as organic semiconductor in organic devices, especially in organic photovoltaics (solar cells) and photodiodes.

In a preferred embodiment the polymers comprise repeating units of the formula

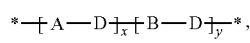

wherein A is a group of formula

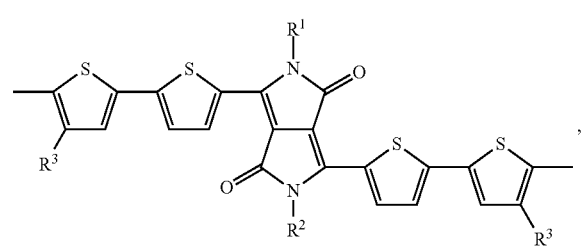

(Ia)

$R^1$ and $R^2$ are a $C_8$-$C_{35}$alkyl group,
$R^3$ is a $C_1$-$C_{18}$alkyl group,
B is a group of formula

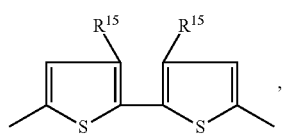

$R^{15}$ is a $C_4$-$C_{18}$alkyl group,
D is a group of formula

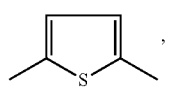

and
x=0.995 to 0.005, y=0.005 to 0.995, especially x=0.4 to 0.9, y=0.6 to 0.1, and wherein x+y=1.

In another preferred embodiment the polymers comprise repeating units of the formula

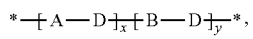

wherein A is a group of formula
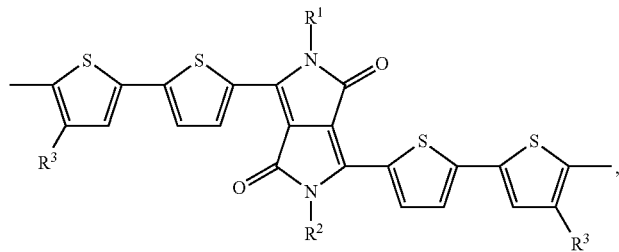 (Ia)
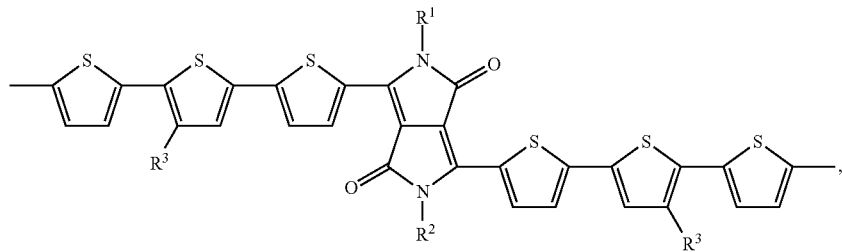 (Ib)
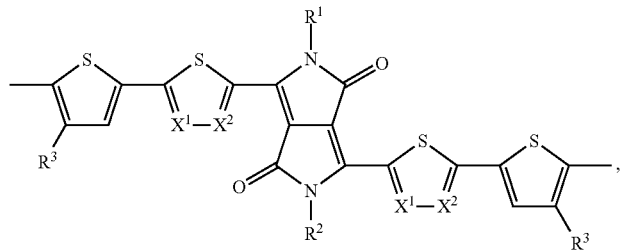 (Ic)
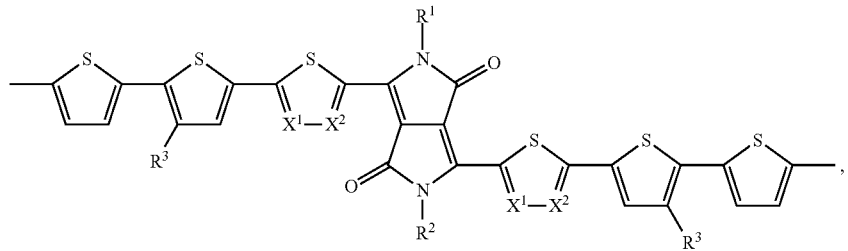 (Id)
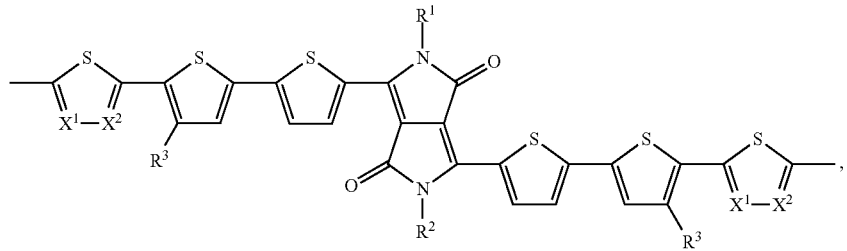 (Ie)
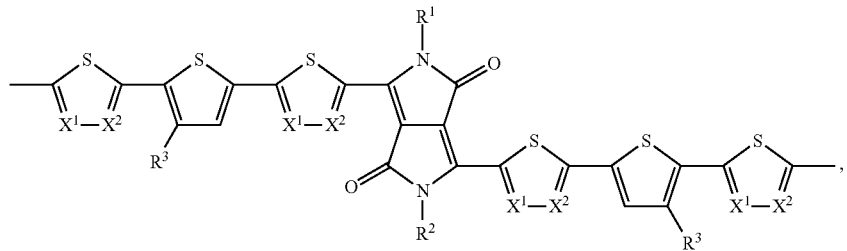 (If)

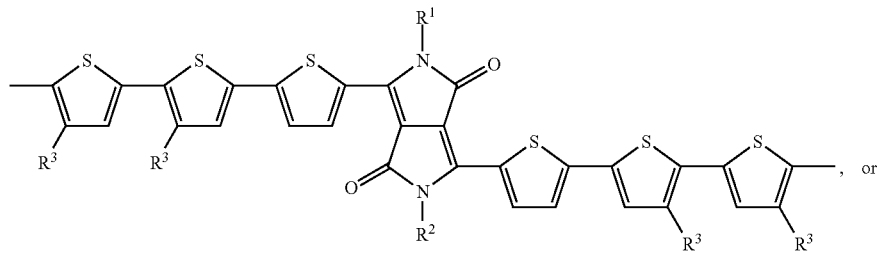

(Ig)

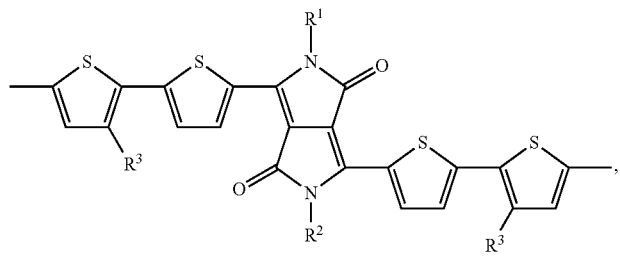

(Ih)

$R^1$ and $R^2$ are a $C_8$-$C_{35}$alkyl group, $R^3$ is a $C_4$-$C_{18}$alkyl group, and B is a group of formula Va, IIb, IIc, IId, IIe, IIf, IIg, IIh, or IIi, or a group of formula Ia, Ib, Ic, Id, Ie, If, or Ig, with the proviso that B is different from A, $R^{1'''}$ and $R^{2'''}$ are a $C_8$-$C_{35}$alkyl group,
one of $X^1$ and $X^2$ is N and the other is CH, D is a group of formula

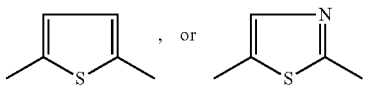

and
x=0.995 to 0.005, y=0.005 to 0.995, and wherein x+y=1.

The polymers of the present invention are distinguished from the polymers, which are explicitly disclosed in WO2010/049323 (such as, for example

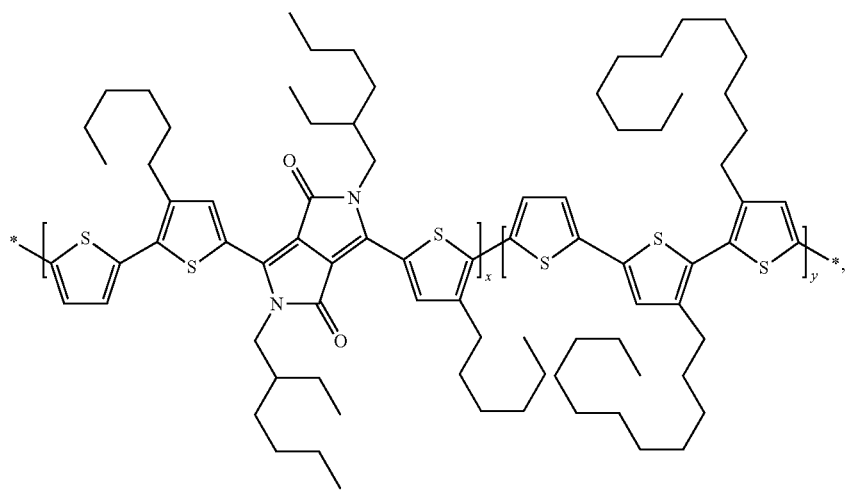

(x = 0.05 to 0.8 and y = 0.95 to 0.2))

in that Ar¹ and Ar² represent an unsubstituted (hetero)arylene group and/or D represent an unsubstituted (hetero)arylene group.

WO2010/108873 relates to polymers comprising one or more (repeating) unit(s) of the formula

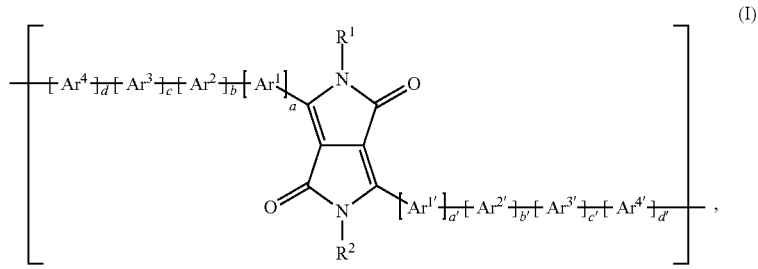

wherein Ar¹ and Ar¹' are independently of each other are an annulated (aromatic) heterocyclic ring system, containing at least one thiophene ring, which may be optionally substituted by one, or more groups (cf. WO2010/135723).

WO2010/115767 comprising a repeating unit of formula

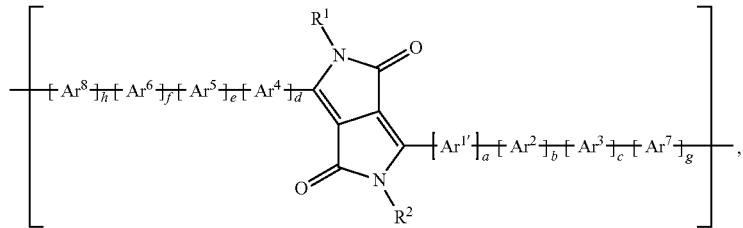

wherein Ar¹' is an annulated (aromatic) heterocyclic ring system, containing at least one thiazole ring, which may be optionally substituted by one, or more groups, WO2010/136352 relates to a process for preparing conjugated polymers with high molecular weight and high regioregularity, and to novel polymers obtainable by this process. An example of a particularly preferred copolymer is shown on page 21 of WO2010/136352:

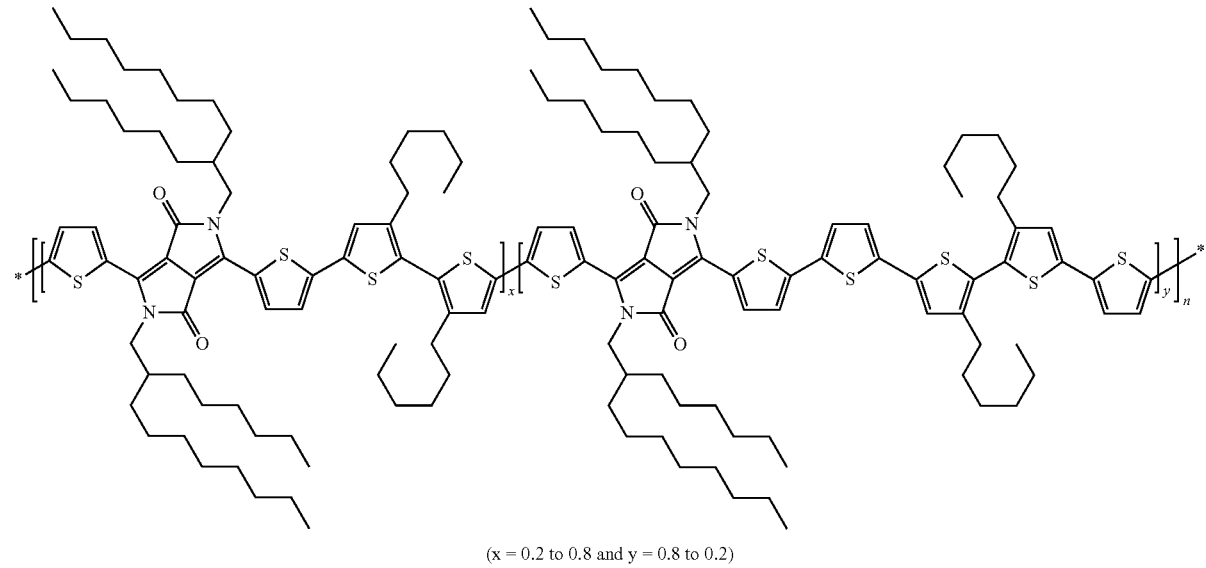

(x = 0.2 to 0.8 and y = 0.8 to 0.2)

The polymers of formula

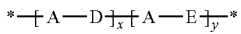  (I)

according to the present invention are distinguished from the polymer disclosed on page 21 of WO2010/136352 in that D cannot be a group of formula

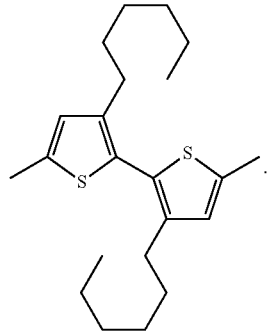

WO2011/144566 relates to polymers comprising one or more (repeating) unit(s) of the formula *─[A-D]─* (I), or a polymer of formula

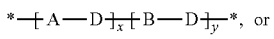, or  (II)

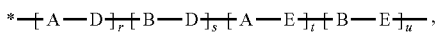,  (III)

and their use as organic semiconductor in organic devices, especially in organic photovoltaics (solar cells) and photodiodes, or in a device containing a diode and/or an organic field effect transistor.

In a preferred embodiment WO2011/144566 is directed to polymers, comprising repeating units of the formula

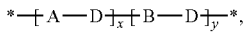,  (II)

wherein
x=0.995 to 0.005, y=0.005 to 0.995, especially x=0.2 to 0.8, y=0.8 to 0.2, and wherein x+y=1;
A is a group of formula IVa, IVc, IVe, IVg, IVh, IVi, or IVj,
$R^1$ and $R^2$ are a $C_1$-$C_{35}$alkyl group, especially a $C_8$-$C_{35}$alkyl group,
$R^{104}$ is a $C_1$-$C_{25}$alkyl group, especially a $C_4$-$C_{25}$alkyl, which may optionally be interrupted by one or more oxygen or sulphur atoms,
B and D are independently of each other a group of formula Va, Vb, Vc, especially

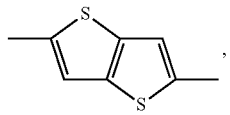,

Ve, Vf, Vh, Vi, Vj, Vk, Vl, Vm, Vn, Vo, Vp, Vq, Vr, Vs, Vu, Vv, Vw, Vx, especially

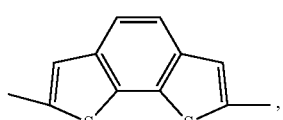,

Vy, Vz, or Va'.

In another preferred embodiment WO2011/144566 is directed to polymers, comprising repeating units of the formula

,  (III)

wherein
r=0.985 to 0.005, s=0.005 to 0.985, t=0.005 to 0.985, u=0.005 to 0.985, and wherein r+s+t+u=1,
A is a group of formula IVa, IVc, IVe, IVg, IVh, IVi, or IVj,
$R^1$ and $R^2$ are a $C_1$-$C_{35}$alkyl group, especially a $C_8$-$C_{35}$alkyl group,
$R^{104}$ is a $C_1$-$C_{25}$alkyl group, especially a $C_4$-$C_{25}$alkyl, which may optionally be interrupted by one or more oxygen or sulphur atoms,
B, D and E are independently of each other a group of formula Va, Vb, Vc, especially

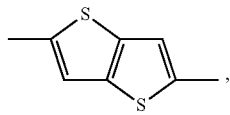,

Ve, Vf, Vh, Vi, Vj, Vk, Vl, Vm, Vn, Vo, Vp, Vq, Vr, Vs, Vu, Vv, Vw, Vx, especially

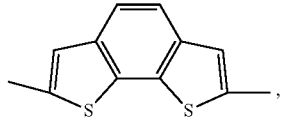,

Vy, Vz, or Va'.

The polymers of the present invention are distinguished from the preferred polymers of WO2011/144566, in that B, D and E are not a DPP repeating unit.

In addition, WO2011/144566 discloses polymers, such as, for example,

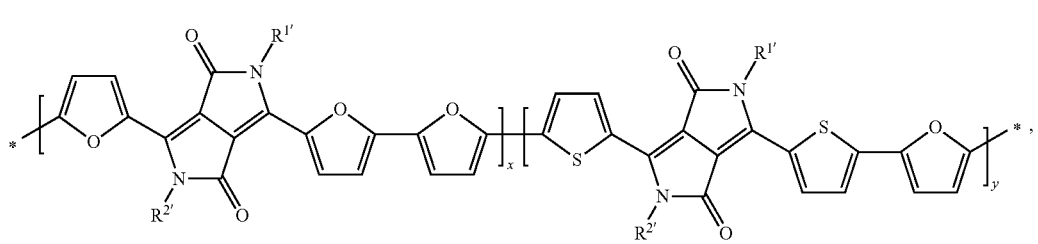

(IIg)

which are neither comprised by the polymers of formula I (two different DPP repeating units, missing repeating unit E) nor II (missing repeating unit E) of the present invention.

It was an aim of the present invention to reduce or overcome the disadvantages in OSC layers of prior art, to provide improved electronic devices, to provide improved OSC materials and components to be used in such devices, and to provide methods for their manufacture. The device should exhibit improved stability, high film uniformity and high integrity of the OSC layer, the materials should have a high charge mobility and good processability, and the method should enable easy and time- and cost-effective device production especially at large scale. Other aims of the present invention are immediately evident to the expert from the following detailed description.

Accordingly, it is the object of the present invention to provide polymers, which show high efficiency of energy conversion, excellent field-effect mobility, good on/off current ratios and/or excellent stability, when used in organic field effect transistors, organic photovoltaics (solar cells) and photodiodes.

Said object has been solved by polymers of formula

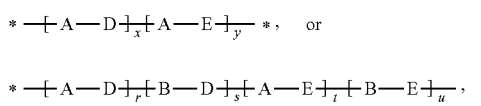

wherein
$x=0.51$ to $0.99$, $y=0.49$ to $0.01$, especially $x=0.70$ to $0.99$, $y=0.30$ to $0.01$, very especially $x=0.80$ to $0.99$ and $y=0.20$ to $0.01$; and wherein
$x+y=1$,
$r+s=0.50$ to $0.99$, $t+u=0.50$ to $0.01$, and wherein $r+s+t+u=1$,
A is a group of formula

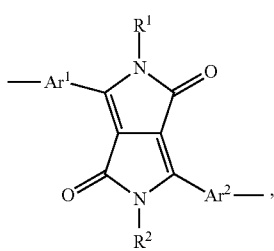

(III)

wherein
$R^1$ and $R^2$ may be the same or different and are selected from hydrogen, a $C_1$-$C_{38}$alkyl group, a $C_2$-$C_{36}$alkenyl group, a $C_3$-$C_{36}$alkinyl group, each of which can optionally be interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group which can optionally be substituted one or more times by $C_1$-$C_{25}$alkyl, $C_1$-$C_8$alkoxy, halogen or cyano;
$Ar^1$ and $Ar^2$ are independently of each other a group of formula

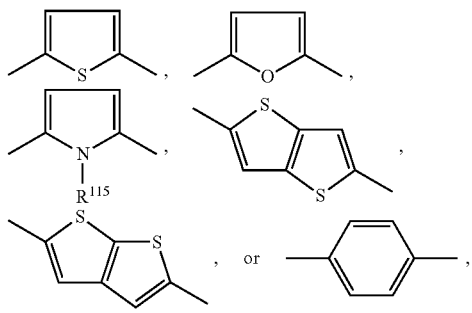

B is a group of formula III, which is different from A,
D has the meaning of $Ar^1$, or is a group of formula

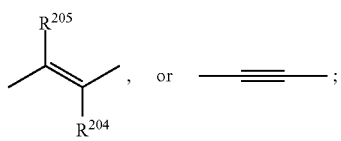

$R^{204}$ and $R^{206}$ are independently of each other H, CN, $COOR^{206}$, or $C_1$-$C_8$alkyl;
$R^{206}$ is a $C_1$-$C_{18}$alkyl group;
E is a group of formula

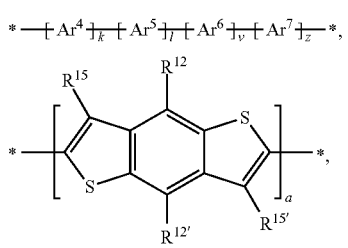

21

-continued

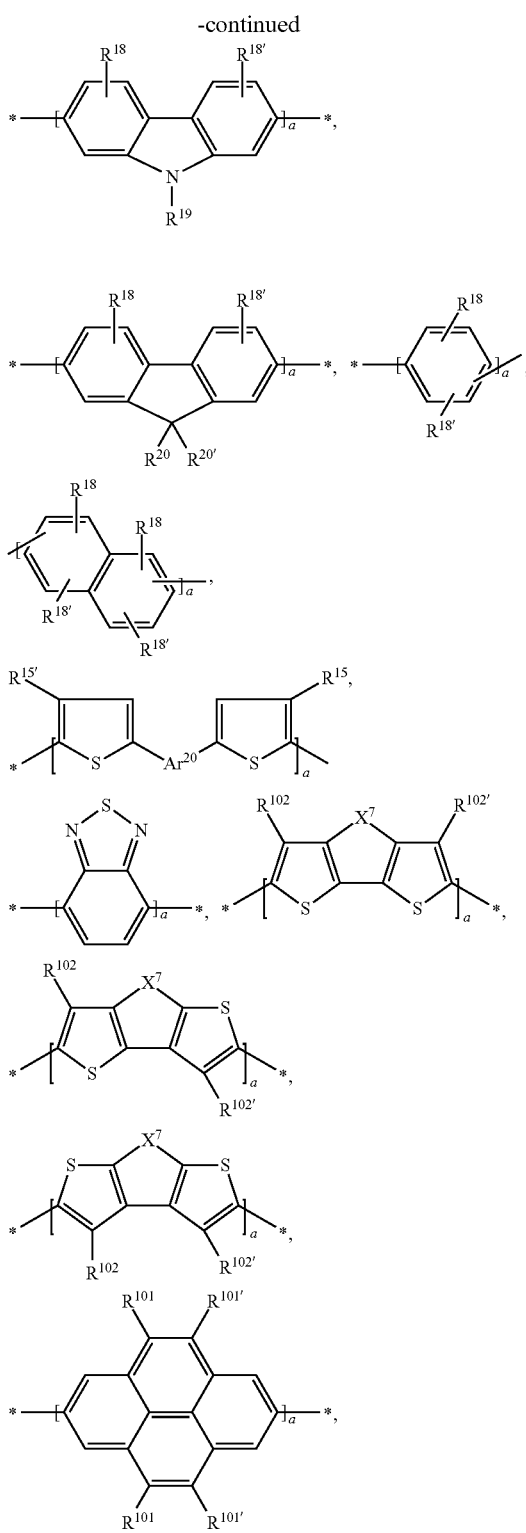

which is different from D, wherein
k is 1,
l is 0, or 1,
v is 0, or 1,
z is 0, or 1,
a is an integer of 1 to 5, especially 1 to 3,

22

$Ar^4$, $Ar^5$, $Ar^6$ and $Ar^7$ are independently of each other a group of formula

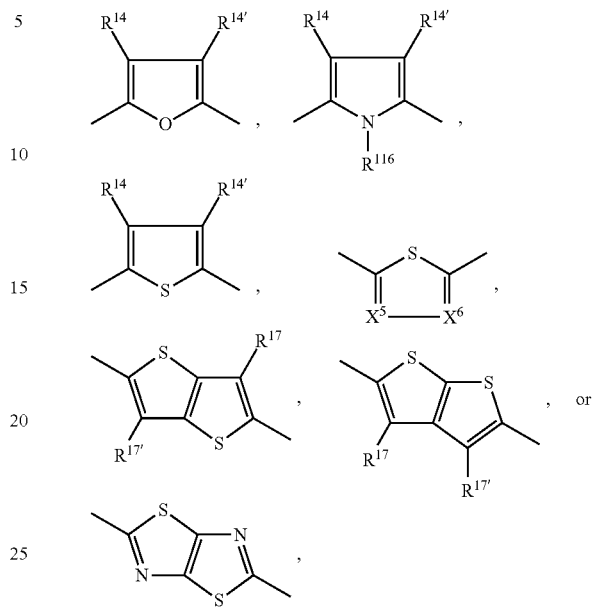

wherein one of $X^5$ and $X^6$ is N and the other is $CR^{14}$, $Ar^{20}$ is an arylene group, or a heteroarylene group, each of which may optionally be substituted,
$R^{12}$ and $R^{12'}$ are independently of each other hydrogen, halogen, $C_1$-$C_{25}$alkyl, especially $C_4$-$C_{25}$alkyl, which may optionally be interrupted by one, or more oxygen, or sulphur atoms, $C_1$-$C_{25}$alkoxy, $C_7$-$C_{25}$arylalkyl, or $$\equiv\!\!-R^{13},$$

$R^{13}$ is a $C_1$-$C_8$alkyl group, or a tri($C_1$-$C_8$alkyl)silyl group,
$R^{14}$, $R^{14'}$, $R^{15}$, $R^{15'}$, $R^{17}$ and $R^{17'}$ are independently of each other H, or a $C_1$-$C_{25}$alkyl group, which may optionally be interrupted by one or more oxygen atoms;
$R^{18}$ and $R^{18'}$ independently of each other hydrogen, halogen, $C_1$-$C_{25}$alkyl, which may optionally be interrupted by one or more oxygen or sulphur atoms, $C_7$-$C_{25}$aralkyl, or $C_1$-$C_{25}$alkoxy;
$R^{19}$ is hydrogen, $C_7$-$C_{25}$aralkyl, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by one or more oxygen or sulphur atoms;
$R^{20}$ and $R^{20'}$ are independently of each other hydrogen, $C_7$-$C_{25}$aralkyl, $C_1$-$C_{25}$alkyl, which may optionally be interrupted by one, or more oxygen, or sulphur atoms,
$X^7$ is —O—, —S—, —$NR^{115}$—, —Si($R^{117}$)($R^{117'}$)—, —C($R^{120}$)($R^{120'}$)—, —C(=O)—,

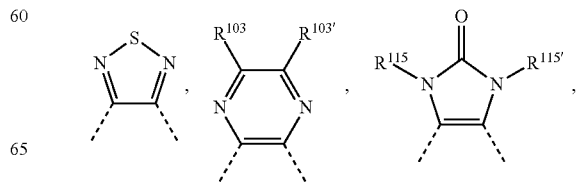

-continued

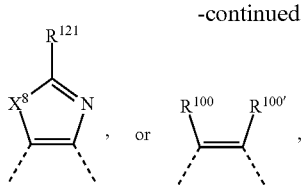

$X^8$ is —O—, or —NR$^{115}$—;

$R^{100}$ and $R^{100'}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by O, $C_1$-$C_{18}$perfluoroalkyl, $C_6$-$C_{24}$aryl, which may optionally be substituted one to three times with $C_1$-$C_8$alkyl and/or $C_1$-$C_8$alkoxy, $C_2$-$C_{20}$heteroaryl, which may optionally be substituted one to three times with $C_1$-$C_8$alkyl and/or $C_1$-$C_8$alkoxy;

$R^{101}$ and $R^{101'}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by O, $C_1$-$C_{18}$ perfluoroalkyl, $C_6$-$C_{24}$aryl, which may optionally be substituted one to three times with $C_1$-$C_8$alkyl and/or $C_1$-$C_8$alkoxy, $C_2$-$C_{20}$heteroaryl, which may optionally be substituted one to three times with $C_1$-$C_8$alkyl and/or $C_1$-$C_8$alkoxy;

$R^{102}$ and $R^{102'}$ are independently of each other H, halogen, $C_1$-$C_{25}$alkyl, which may optionally be interrupted by one or more oxygen or sulphur atoms; $C_7$-$C_{25}$arylalkyl, or $C_1$-$C_{25}$alkoxy;

$R^{103}$ and $R^{103'}$ are independently of each other hydrogen, halogen, $C_1$-$C_{25}$alkyl, which may optionally be interrupted by one or more oxygen or sulphur atoms; $C_6$-$C_{24}$aryl, which may optionally be substituted one to three times with $C_1$-$C_8$alkyl and/or $C_1$-$C_8$alkoxy; $C_7$-$C_{25}$arylalkyl, CN, or $C_1$-$C_{25}$alkoxy; or $R^{103}$ and $R^{103'}$ together form a ring, $R^{115}$ and $R^{115'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; $C_1$-$C_{25}$alkyl, which may optionally be interrupted by one or more oxygen or sulphur atoms; or $C_7$-$C_{25}$arylalkyl, $R^{116}$ is hydrogen, $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$ perfluoroalkyl, or $C_1$-$C_{18}$alkoxy; $C_1$-$C_{25}$alkyl; $C_1$-$C_{25}$alkyl which is interrupted by —O—, or —S—; or —COOR$^{119}$; $R^{119}$ is $C_1$-$C_{38}$alkyl;

$R^{117}$ and $R^{117'}$ are independently of each other $C_1$-$C_{35}$alkyl group, $C_7$-$C_{25}$arylalkyl, or a phenyl group, which optionally can be substituted one to three times with $C_1$-$C_8$alkyl and/or $C_1$-$C_8$alkoxy, $R^{120}$ and $R^{120'}$ are independently of each other hydrogen, $C_1$-$C_{38}$alkyl, which may optionally be interrupted by one, or more oxygen, or sulphur atoms; or $C_7$-$C_{25}$arylalkyl, $R^{121}$ is H, $C_1$-$C_{18}$alkyl, which may optionally be interrupted by one or more oxygen or sulphur atoms; $C_1$-$C_{18}$perfluoroalkyl, $C_6$-$C_{24}$aryl, which may optionally be substituted one to three times with $C_1$-$C_8$alkyl and/or $C_1$-$C_8$alkoxy; $C_2$-$C_{20}$heteroaryl, which may optionally be substituted one to three times with $C_1$-$C_8$alkyl and/or $C_1$-$C_8$alkoxy; or CN.

Preferably, $R^{12}$ and $R^{12'}$ are independently of each other hydrogen, halogen, $C_1$-$C_{25}$alkyl, especially $C_4$-$C_{25}$alkyl, which may optionally be interrupted by one, or more oxygen, or sulphur atoms, $C_1$-$C_{25}$alkoxy, $C_7$-$C_{25}$arylalkyl, or $$\text{———}R^{13},$$

Preferably, $R^{13}$ is a $C_1$-$C_8$alkyl group, or a tri($C_1$-$C_8$alkyl) silyl group, Preferably, $R^{15}$ and $R^{15'}$ are independently of each other H, or a $C_1$-$C_{25}$alkyl group, which may optionally be interrupted by one or more oxygen atoms, Preferably, $R^{18}$ and $R^{18'}$ are independently of each other hydrogen, halogen, $C_1$-$C_{25}$alkyl, especially $C_4$-$C_{25}$alkyl, which may optionally be interrupted by one or more oxygen or sulphur atoms, $C_7$-$C_{25}$aralkyl, or $C_1$-$C_{25}$alkoxy.

Preferably, $R^{20}$ and $R^{20'}$ are independently of each other hydrogen, $C_7$-$C_{25}$aralkyl, $C_1$-$C_{25}$alkyl, especially $C_4$-$C_{25}$alkyl, which may optionally be interrupted by one, or more oxygen, or sulphur atoms.

Preferably, $R^{100}$, $R^{100'}$, $R^{102}$ and $R^{102'}$ are hydrogen. Preferably, $R^{120}$ and $R^{120'}$ are $C_1$-$C_{38}$alkyl.

$R^1$ and $R^2$ may be different, but are preferably the same. Preferably, $R^1$ and $R^2$ are a $C_1$-$C_{38}$alkyl group, preferably a $C_4$-$C_{24}$alkyl group, more preferably a $C_8$-$C_{24}$alkyl group, such as, for example, n-dodecyl, tridecyl, tetradecyl, pentadecyl, hexadecyl, 2-ethyl-hexyl, 2-butyl-hexyl, 2-butyl-octyl, 2-hexyl-decyl, 2-octyl-dodecyl, 2-decyl-tetradecyl, heptadecyl, octadecyl, eicosyl, heneicosyl, docosyl, or tetracosyl. The $C_1$-$C_{38}$alkyl, $C_4$-$C_{24}$alkyl group and $C_8$-$C_{24}$alkyl group can be linear, or branched, but are preferably branched.

Advantageously, the groups $R^1$ and $R^2$ can be represented by formula

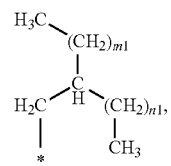

wherein m1=n1+2 and m1+n1≤24. Chiral side chains, such as $R^1$ and $R^2$ can either be homochiral, or racemic, which can influence the morphology of the compounds.

Preferably x=0.70 to 0.99 and y=0.30 to 0.01, most preferred x=0.80 to 0.99 and y=0.20 to 0.01. x and y represent the amount of respective repeating units used in the production of the corresponding polymer of formula (I).

r+s=0.50 to 0.99, t+u=0.50 to 0.01, especially r+s=0.80 to 0.99, t+u=0.20 to 0.01. r, s, t and u represent the amount of the respective repeating units used in the production of the corresponding polymer of formula (II).

In a preferred embodiment $Ar^1$ and $Ar^2$ are independently of each other a group of formula

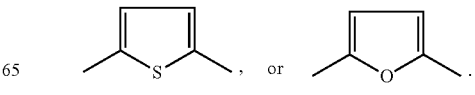

A is preferably a group of formula

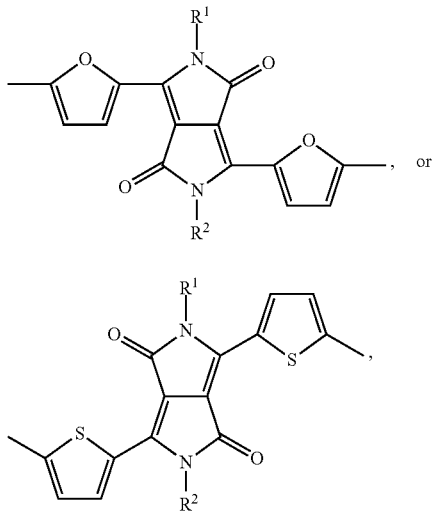

wherein $R^1$ and $R^2$ are independently of each other a $C_1$-$C_{38}$alkyl group. A group of formula IIIb is more preferred than a group of formula IIIa.

D is preferably a group of formula

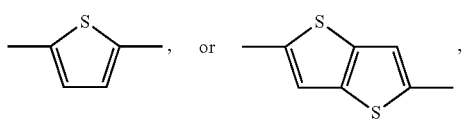

E is preferably a group of formula

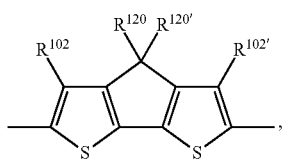

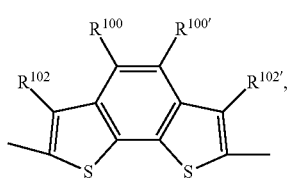

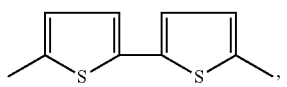

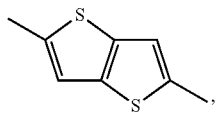

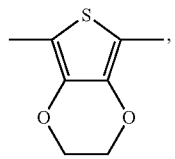

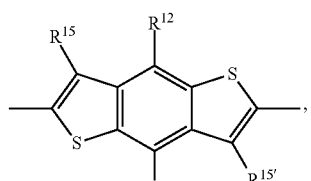

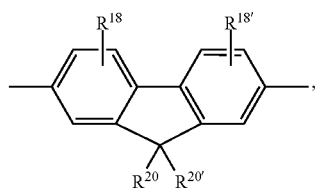

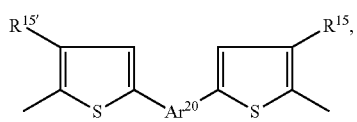

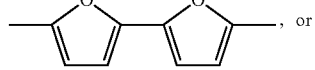

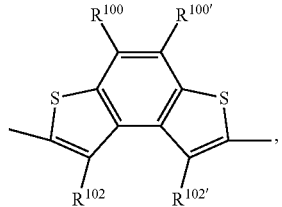

wherein $R^{100}$, $R^{100'}$, $R^{102}$, $R^{102'}$, $R^{120}$ and $R^{120'}$ are as defined above, $Ar^{20}$ is an arylene group, which may optionally be substituted, or a heteroarylene group, $R^{12}$ and $R^{12'}$ are independently of each other hydrogen, halogen, $C_1$-$C_{25}$alkyl, especially $C_4$-$C_{25}$alkyl, which may optionally be interrupted by one, or more oxygen, or sulphur atoms, $C_1$-$C_{25}$alkoxy, $C_7$-$C_{25}$arylalkyl, or

$R^{13}$ is a $C_1$-$C_8$alkyl group, or a tri($C_1$-$C_8$alkyl)silyl group, $R^{15}$ and $R^{15'}$ are independently of each other H, or a $C_1$-$C_{25}$alkyl group, which may optionally be interrupted by one or more oxygen atoms, $R^{18}$ and $R^{18'}$ independently of each other hydrogen, halogen, $C_1$-$C_{25}$alkyl, especially $C_4$-$C_{25}$alkyl, which may optionally be interrupted by one or more oxygen or sulphur atoms, $C_7$-$C_{25}$aralkyl, or $C_1$-$C_{25}$alkoxy; and $R^{20}$ and $R^{20'}$ are independently of each other hydrogen, $C_7$-$C_{25}$aralkyl, $C_1$-$C_{25}$alkyl, especially $C_4$-$C_{25}$alkyl, which may optionally be interrupted by one, or more oxygen, or sulphur atoms.

Examples of the arylene group are groups of formula

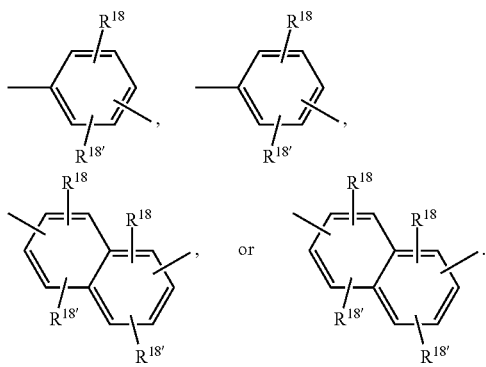

$R^{18}$ and $R^{18'}$ are independently of each other hydrogen, halogen, $C_1$-$C_{25}$alkyl, especially $C_4$-$C_{25}$alkyl, which may optionally be interrupted by one or more oxygen, or sulphur atoms, $C_7$-$C_{25}$aralkyl, or $C_1$-$C_{25}$alkoxy.

Examples of the heteroarylene group are groups of formula

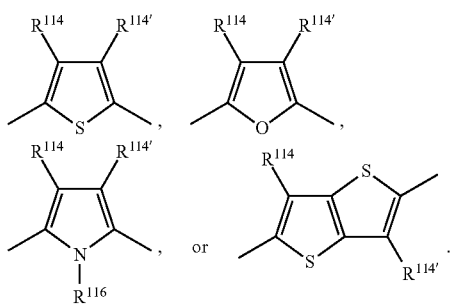

$R^{114}$ and $R^{114'}$ are independently of each other hydrogen, or $C_1$-$C_{18}$alkyl, and $R^{116}$ is H, or $C_1$-$C_{25}$alkyl.

In a preferred embodiment the present invention is directed to polymers, comprising repeating units of the formula

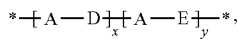
(I)

wherein
x=0.70 to 0.99, y=0.30 to 0.01, especially x=0.80 to 0.99, y=0.20 to 0.01, and wherein x+y=1,
A is a group of formula

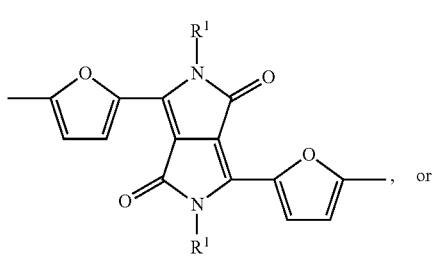
(IIIa′)
or

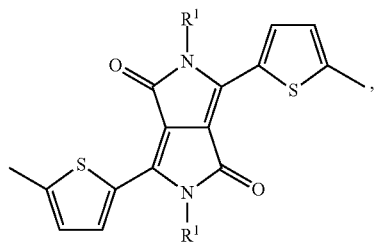
(IIIb′)

wherein $R^1$ is a $C_1$-$C_{38}$alkyl group, especially a $C_8$-$C_{38}$alkyl group,
D is a group of formula

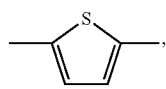

E is a group of formula

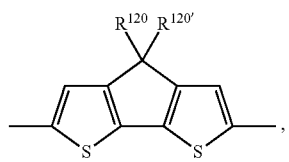
(Va′)

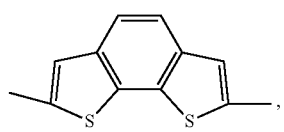
(Vb′)

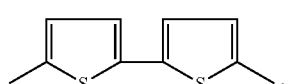
(Vc′)

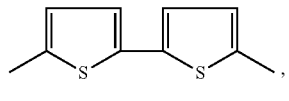
(Vd′)

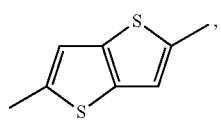
(Vf′)

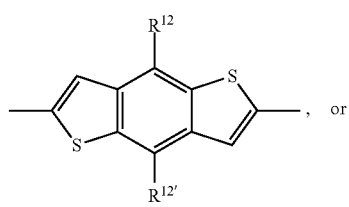
, or

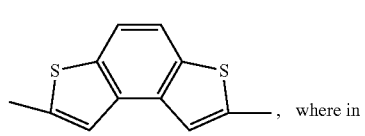
(Vj′)
, where in $R^{12}$ and $R^{12'}$ are independently of each other hydrogen, halogen, $C_1$-$C_{25}$alkyl, which may optionally be interrupted by one or more oxygen, or sulphur atoms, $C_1$-$C_{25}$alkoxy, $C_7$-$C_{25}$arylalkyl, or

$R^{13}$ is a $C_1$-$C_8$alkyl group, or a tri($C_1$-$C_8$alkyl)silyl group, and $R^{120}$ and $R^{120'}$ are independently of each other hydrogen, or $C_1$-$C_{38}$alkyl, which may optionally be interrupted by one, or more oxygen, or sulphur atoms.

A group of formula (IIIa') is less preferred than a group of formula (IIIb').

In another preferred embodiment the present invention is directed to polymers comprising repeating units of the formula

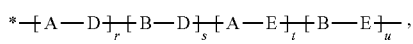   (II)

wherein
r+s=0.70 to 0.99, t+u=0.30 to 0.01, especially r+s=0.80 to 0.99, t+u=0.20 to 0.01, and wherein r+s+t+u=1,
A is a group of formula

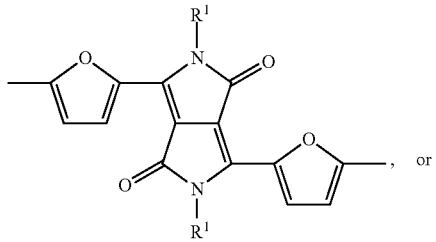   (IIIa')

or

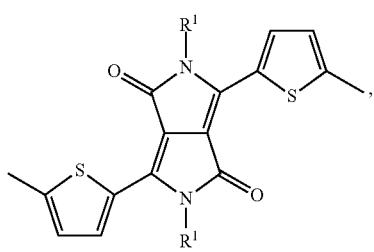   (IIIb')

B is a group of formula

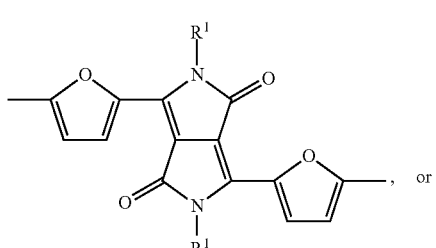   (IIIa')

or

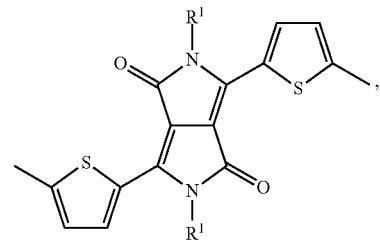   (IIIb')

which is different from A, wherein
$R^1$ is a $C_1$-$C_{38}$alkyl group, especially a $C_8$-$C_{38}$alkyl group,
D is a group of formula

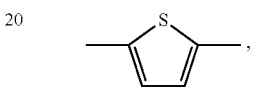

E is a group of formula

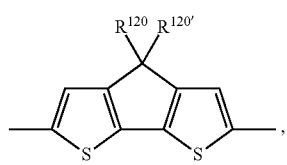   (Va')

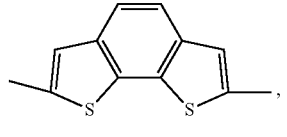   (Vb')

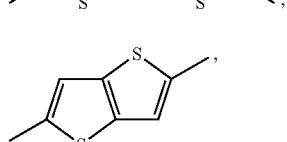   (Vc')

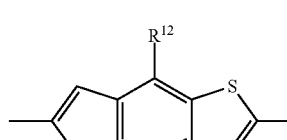   (Vd')

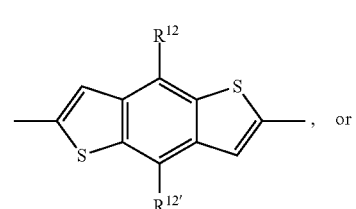   (Vf')

or

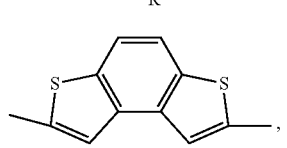   (Vj')

wherein
$R^{12}$ and $R^{12'}$ are independently of each other hydrogen, halogen, $C_1$-$C_{25}$alkyl, which may optionally be interrupted by one, or more oxygen, or sulphur atoms, $C_1$-$C_{25}$alkoxy, $C_7$-$C_{25}$arylalkyl, or

——≡——$R^{13}$, $R^{13}$ is a $C_1$-$C_8$alkyl group, or a tri($C_1$-$C_8$alkyl)silyl group, and $R^{120}$ and $R^{120'}$ are independently of each other hydrogen, or $C_1$-$C_{38}$alkyl, which may optionally be interrupted by one, or more oxygen, or sulphur atoms.

A group of formula (IIIa') is less preferred than a group of formula (IIIb').

In said embodiment A may be a group of formula (IIIb″)

wherein $R^1$ is a linear $C_2$-$C_{24}$alkyl group, especially a linear $C_8$-$C_{24}$alkyl group, B is a group of formula (IIIb')

wherein $R^2$ is a branched $C_2$-$C_{24}$alkyl group, especially a branched $C_8$-$C_{24}$alkyl group; or A is a group of formula

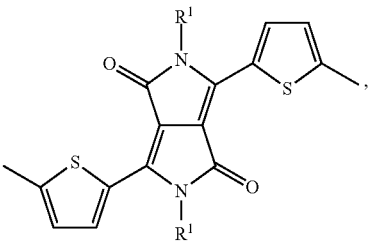

(IIIb')

and

B is a group of formula

(IIIb')

wherein $R^1$ and $R^2$ are different and are a linear, or branched $C_2$-$C_{24}$alkyl group.

An example of a preferred polymer is shown below:

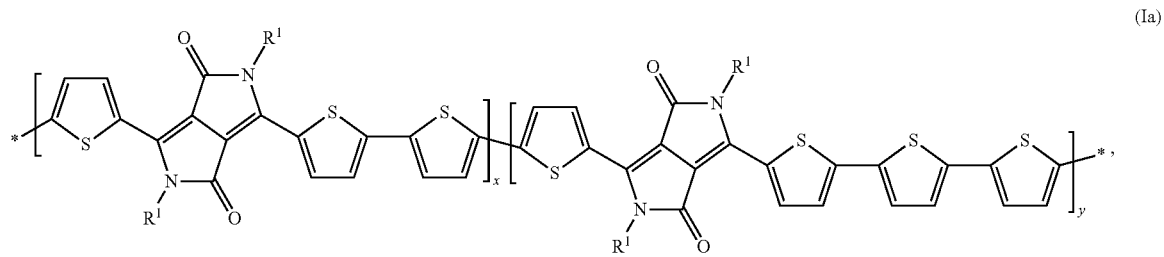

(Ia)

wherein x=0.70 to 0.99, y=0.30 to 0.01, especially x=0.80 to 0.99, y=0.20 to 0.01, and wherein x+y=1, and $R^1$ is a $C_2$-$C_{24}$alkyl group. The $C_2$-$C_{24}$alkyl group is preferably a branched $C_2$-$C_{24}$alkyl group, such as, for example, a 2-hexyl-decyl, a 2-octyl-dodecyl, or a 2-decyl-tetradecyl group.

Polymers of formula I, or II can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995).

To prepare polymers corresponding to formula I a dihalogenide corresponding to formula $X^{11'}$-A-$X^{11'}$ is reacted with diboronic acids, or diboronates corresponding to formulae $X^{11}$-D-$X^{11}$ and $X^{11}$-E-$X^{11}$; or a diboronic acid, or a diboronate corresponding to formula $X^{11}$-A-$X^{11}$ is reacted with dihalogenides corresponding to formulae $X^{11'}$-D-$X^{11'}$ and $X^{11'}$-E-$X^{11'}$, wherein $X^{11'}$ is independently in each occurrence Cl, Br, or I, and $X^{11}$ is independently in each occurrence —B(OH)$_2$, —B(OY$^1$)$_2$,

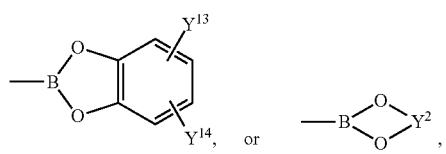

wherein $Y^1$ is independently in each occurrence a $C_1$-$C_{10}$alkyl group and $Y^2$ is independently in each occurrence a $C_2$-$C_{10}$alkylene group, such as —CY$^3$Y$^4$—CY$^5$Y$^6$—, or —CY$^7$Y$^8$—CY$^9$Y$^{10}$—CY$^{11}$Y$^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —C(CH$_3$)$_2$C(CH$_3$)$_2$—, —CH$_2$C(CH$_3$)$_2$CH$_2$—, or —C(CH$_3$)$_2$CH$_2$C(CH$_3$)$_2$—, and $Y^{13}$ and $Y^{14}$ are independently of each other hydrogen, or a $C_1$-$C_{10}$alkyl group, in a solvent and in the presence of a catalyst, such as, for example, under the catalytic action of Pd and triphenylphosphine. To prepare polymers corresponding to formula II dihalogenides corresponding to formulae) $X^{11'}$-A-$X^{11'}$ and $X^{11'}$-B-$X^{11'}$ are reacted with diboronic acids, or diboronates corresponding to formulae $X^{11}$-D-$X^{11}$ and $X^{11}$-E-$X^{11}$; or diboronic acids, or diboronates corresponding to formulae $X^{11}$-A-$X^{11}$ and $X^{11'}$-E-$X^{11'}$ are reacted with dihalogenides corresponding to formulae $X^{11'}$-D-$X^{11'}$ and $X^{11'}$-E-$X^{11'}$; wherein r, s, t, u, v, x and y, $X^{11}$, $X^{11'}$, A, B, D and E are as defined above.

Preferred catalysts are 2-dicyclohexylphosphino-2',6'-dialkoxybiphenyl/palladium(II) acetates, tri-alkyl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ((t-Bu)$_3$P*HBF$_4$)/tris(dibenzylideneacetone) dipalladium (0) (Pd$_2$(dba)$_3$) and tri-tert-butylphosphine (t-Bu)$_3$P/tris(dibenzylideneacetone)dipalladium (0) (Pd$_2$(dba)$_3$). The reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

A particularly preferred process is described in WO2010/136352. According to the process described in WO2010/136352 the polymerisation is carried out in presence of
a) a catalyst/ligand system comprising a palladium catalyst and a specific organic phosphine, or phosphonium compound,
b) a base,
c) a solvent or a mixture of solvents. Preferred organic phosphines are selected from trisubstituted phosphines of formula (VI)

[Structure of formula VI showing pyrrole ring with substituents $R^{303}$, $R^{304}$, $R^{305}$, $R^{306}$ and phosphorus with $R^{1''}$ groups]

| Cpd. | $R^{1''}$ | $R^{305}$ | $R^{306}$ | $R^{303}$ | $R^{304}$ |
|------|-----------|-----------|-----------|-----------|-----------|
| A-1 | H$_3$C-C(CH$_3$)$_2$-CH$_3$ (t-Bu) | H | H | H | H |
| A-2 | cyclohexyl | H | H | H | H |
| A-3 | phenyl | H | H | H | H |
| A-4 | adamantyl | H | H | H | H |
| A-5 | cyclohexyl | —OCH$_3$ | H | H | H |
| A-6 | cyclohexyl | 1) | 1) | H | H |
| A-7 | H$_3$C-C(CH$_3$)$_2$-CH$_3$ (t-Bu) | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | H$_3$C-C(CH$_3$)$_2$-CH$_3$ (t-Bu) | H | H | 2) | 2) |
| A-12 | phenyl | H | H | 2) | 2) |
| A-13 | adamantyl | H | H | 2) | 2) |

1) $R^{305}$ and $R^{306}$ together form a ring

2) $R^{303}$ and $R^{304}$ together form a ring

Examples of preferred catalysts include the following compounds:
palladium(II) acetylacetonate, palladium(0) dibenzylideneacetone complexes, palladium(II) propionate,
$Pd_2(dba)_3$: [tris(dibenzylideneacetone)dipalladium(0)],
$Pd(dba)_2$: [bis(dibenzylideneacetone) palladium(0)],
$Pd(PR_3)_2$, wherein $PR_3$ is a trisubstituted phosphine of formula VI,
$Pd(OAc)_2$: [palladium(II) acetate], palladium(II) chloride, palladium(II) bromide, lithium tetrachloropalladate(II),
$PdCl_2(PR_3)_2$; wherein $PR_3$ is a trisubstituted phosphine of formula VI; palladium(0) diallyl ether complexes, palladium (II) nitrate,
$PdCl_2(PhCN)_2$: [dichlorobis(benzonitrile) palladium(II)],
$PdCl_2(CH_3CN)$: [dichlorobis(acetonitrile) palladium(II)], and
$PdCl_2(COD)$: [dichloro(1,5-cyclooctadiene) palladium(II)].

Especially preferred are $PdCl_2$, $Pd_2(dba)_3$, $Pd(dba)_2$, $Pd(OAc)_2$, or $Pd(PR_3)_2$. Most preferred are $Pd_2(dba)_3$ and $Pd(OAc)_2$.

The palladium catalyst is present in the reaction mixture in catalytic amounts. The term "catalytic amount" refers to an amount that is clearly below one equivalent of the (hetero) aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous $LiOHxH_2O$ (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1, especially 0.2 to 100 hours.

In a preferred embodiment of the present invention the solvent is THF, the base is Li—OH*$H_2O$ and the reaction is conducted at reflux temperature of THF (about 65° C.).

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

Advantageously, the polymerisation is carried out in presence of a) palladium(II) acetate, or $Pd_2(dba)_3$, (tris(dibenzylideneacetone)dipalladium(0)) and an organic phosphine A-1 to A-13,
b) LiOH, or $LiOHxH_2O$; and
c) THF, and optionally water. If the monohydrate of LiOH is used, no water needs to be added.

Preferably the polymerization reaction is conducted under inert conditions in the absence of oxygen. Nitrogen and more preferably argon are used as inert gases.

The process described in WO2010/136352 is suitable for large-scale applications, is readily accessible and convert starting materials to the respective polymers in high yield, with high purity and high selectivity. If desired, a monofunctional aryl halide or aryl boronate may be used as a chain-terminator in such reactions, which will result in the formation of a terminal aryl group.

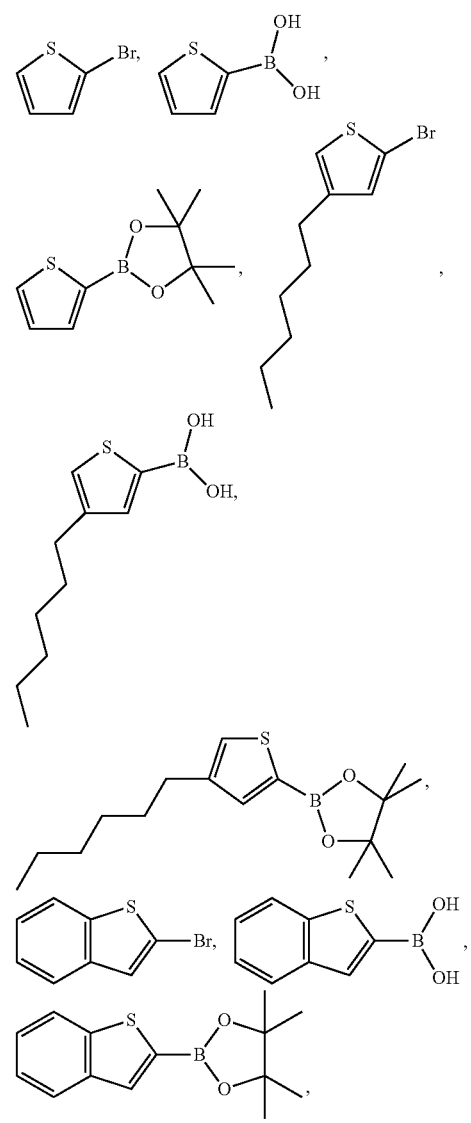

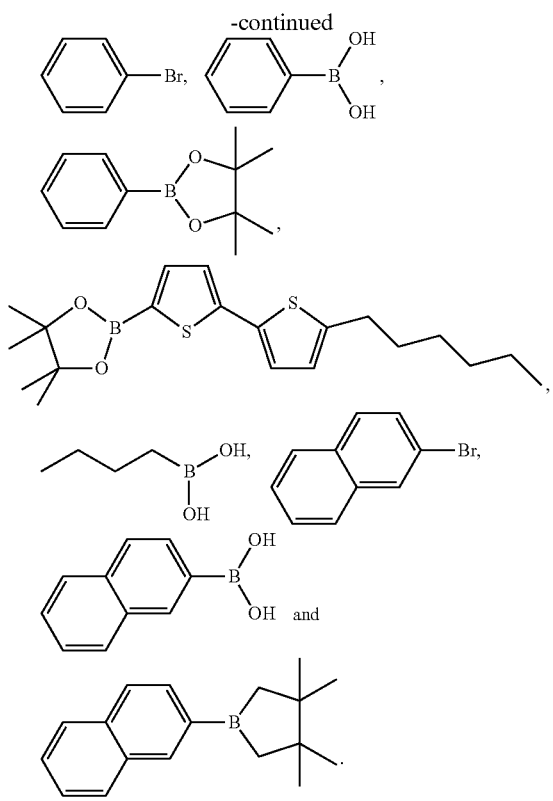

It is possible to control the sequencing of the monomeric units in the resulting copolymer by controlling the order and composition of monomer feeds in the Suzuki reaction.

Alternative preparation methods for the polymers of the present invention are illustrated in more detail below for polymers of formula I. Polymers of formula II can be prepared using the methods described for the preparation of the polymers of formula I.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508).

To prepare polymers corresponding to formula I a dihalogenide of formula $X^{11'}$-A-$X^{11'}$ is reacted with a compounds of formulae $X^{21}$-D-$X^{21}$ and $X^{21}$-E-$X^{21}$; or dihalogenides of formulae $X^{11'}$-D-$X^{11'}$ and $X^{11'}$-E-$X^{11'}$ are reacted with compound of formula $X^{21}$-A-$X^{21}$, wherein $X^{21}$ is a group —$SnR^{207}R^{208}R^{209}$ and $X^{11'}$ is as defined above, in an inert solvent at a temperature in range from 0° C. to 200° C. in the presence of a palladium-containing catalyst, wherein $R^{207}$, $R^{208}$ and $R^{209}$ are identical or different and are H or $C_1$-$C_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents A-$(ZnX^{22})_2$, wherein $X^{22}$ is halogen and halides, and D-$(X^{23})_2$ and E-$(X^{23})_2$, wherein $X^{23}$ is halogen or triflate, or using D-$(X^{22})_2$, E-$(X^{22})_2$, and A-$(ZnX^{23})_2$. Reference is, for example, made to E. Negishi et al., Heterocycles 18 (1982) 117-22.

Alternatively, the polymers of the present invention can also be synthesized by the Hiyama reaction using organosilicon reagents A-$(SiR^{210}R^{211}R^{212})_2$, wherein $R^{210}$, $R^{211}$ and $R^{212}$ are identical or different and are halogen, or $C_1$-$C_6$alkyl, and D-$(X^{23})_2$ and E-$(X^{23})_2$, wherein $X^{23}$ is halogen or triflate, or using A-$(X^{23})_2$, D-$(SiR^{210}R^{211}R^{212})_2$ and E-$(SiR^{210}R^{211}R^{212})_2$. Reference is, for example, made to T. Hiyama et al., Pure Appl. Chem. 66 (1994) 1471-1478 and T. Hiyama et al., Synlett (1991) 845-853.

Halogen is fluorine, chlorine, bromine and iodine, especially fluorine.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl. A haloalkyl group is an alkyl group, wherein one, or more than one hydrogen atoms are repled by halogen atoms. Examples are $C_1$-$C_4$ perfluoroalkyl groups, which may be branched or unbranched, such as, for example, —$CF_3$, —$CF_2CF_3$, —$CF_2CF_2CF_3$, —$CF(CF_3)_2$, —$(CF_2)_3CF_3$, and —$C(CF_3)_3$.

$C_1$-$C_{25}$alkoxy ($C_1$-$C_{18}$alkoxy) groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy.

Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{38}$alkenyl groups are straight-chain or branched alkenyl groups and may be unsubstituted or substituted. Examples are allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_2$-$C_{38}$alkynyl is straight-chain or branched and may be unsubstituted or substituted. Examples are ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_7$-$C_{100}$arylalkyl group is typically $C_7$-$C_{25}$aralkyl. The arylalkyl groups can be substituted one to five times with $C_1$-$C_8$alkyl, $C_1$-$C_8$alkoxy, $CF_3$ and/or F. Examples are benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

The arylen group is typically a $C_6$-$C_{24}$arylen group, which optionally can be substituted. Examples are phenylene, 4-methylphenylene, 4-methoxyphenylene, naphthylene, especially 1-naphthylene, or 2-naphthylene, pyrenylene, 2- or 9-fluorenylene, phenanthrylene, or anthrylene, which may be unsubstituted or substituted by one, or more $C_1$-$C_{18}$alkyl groups.

The $C_2$-$C_{30}$heteroarylen groups $A^4$, $A^5$ and $A^6$, which optionally can be substituted by G, represent a ring with five to seven ring atoms or a condensed ring system, wherein nitrogen, oxygen or sulfur are the possible hetero atoms, and is typically a heterocyclic group with five to 30 atoms having at least six conjugated-electrons such as thienylene, thienothienylene, benzothiophenylene, dibenzothiophenylene, thianthrenylene, furylene, furfurylene, 2H-pyranylene, benzofuranylene, isobenzofuranylene, dibenzofuranylene, phenoxythienylene, pyrrolylene, imidazolylene, pyrazolylene, pyridylene, bipyridylene, triazinylene, pyrimidinylene, pyrazinylene, pyridazinylene, indolizinylene, isoindolylene, indolylene, indazolylene, purinylene, quinolizinylene, chinolylene, isochinolylene, phthalazinylene, naphthyridinylene, chinoxalinylene, chinazolinylene, cinnolinylene, pteridinylene, carbazolylene, carbolinylene, benzotriazolylene, benzoxazolylene, phenanthridinylene, acridinylene, pyrimidinylene, phenanthrolinylene, phenazinylene, isothiazolylene, phenothiazinylene, isoxazolylene, furazanylene, carbazolylene, or phenoxazinylene, which can be unsubstituted or substituted by one, or more $C_1$-$C_{18}$alkyl groups.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a, a nitro group, or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{25}$alkyl interrupted by one or more O is, for example, $(CH_2CH_2O)_{1-9}$—$R^x$, where $R^x$ is H or $C_1$-$C_{10}$alkyl, $CH_2$—$CH(OR^{y'})$—$CH_2$—O—$R^y$, where $R^y$ is $C_1$-$C_{18}$alkyl, and $R^{y'}$ embraces the same definitions as $R^y$ or is H. $C_1$-$C_{25}$alkyl interrupted by one or more S is, for example, $(CH_2CH_2S)_{1-9}$—$R^x$, where $R^x$ is H or $C_1$-$C_{10}$alkyl, $CH_2$—$CH(SR^{y'})$—$CH_2$—S—$R^y$, where $R^y$ is $C_1$-$C_{18}$alkyl, and $R^{y'}$ embraces the same definitions as $R^y$ or is H.

If a substituent, such as, for example, $R^{101}$, occurs more than one time in a group, it can be different in each occurrence.

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, a polymeric binder, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

Accordingly, the present invention also relates to an organic semiconductor material, layer or component, comprising (a) a polymer according to the present invention, and (b) optionally another material.

In a preferred embodiment the other material is a small molecule. Such small molecules are described, for example, in WO2010/108873, WO09/047,104, U.S. Pat. No. 6,690,029, WO2007082584 (including, but not limited to compounds (I1), (I2), (I3), (I4), (I5), (I6), (I7), (I8), and (I9)), WO2008107089 (including, but not limited to compounds A1, A2, B1, B2, C1 and C2) and WO2009047104.

The small molecule is preferably a compound of formula

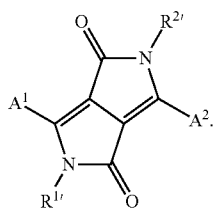

(VI)

wherein
$A^1$ and $A^2$ are independently of each other a group of formula

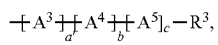

a' is 1, or 2; b is 0, or 1; c is 0, or 1;
$R^{1'}$ and $R^{2'}$ may be the same or different and are selected from hydrogen, a $C_1$-$C_{38}$alkyl group, a $C_2$-$C_{38}$alkenyl group, a $C_3$-$C_{38}$alkinyl group, each of which can optionally be interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group which can optionally be substituted one or more times by $C_1$-$C_{25}$alkyl, $C_1$-$C_8$alkoxy, halogen or cyano;
$A^3$, $A^4$ and $A^5$ are independently of each other a bivalent group of formula

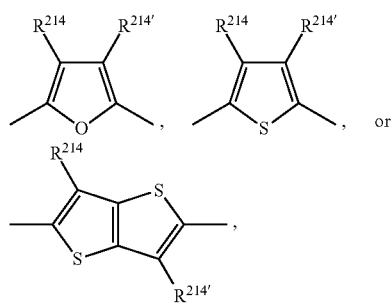

$R^{214}$ and $R^{214'}$ are independently of each other hydrogen, halogen, halogenated $C_1$-$C_{25}$alkyl, especially $CF_3$, cyano, $C_1$-$C_{25}$alkyl, which may optionally be interrupted by one or more oxygen or sulphur atoms; $C_7$-$C_{25}$arylalkyl, or $C_1$-$C_{25}$alkoxy;
$R^3$ is hydrogen, halogen, cyano, $C_1$-$C_{25}$alkyl,

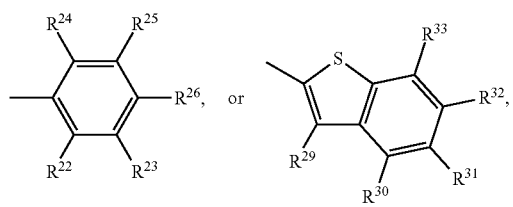

wherein $R^{22}$ to $R^{25}$ and $R^{29}$ to $R^{33}$ represent independently of each other H, halogen, cyano, or $C_1$-$C_{25}$alkyl, and $R^{26}$ is H, halogen, cyano, phenyl, or $C_1$-$C_{25}$alkyl.
The compound of formula VI is used in an amount of 0.1 to 99.9%, especially 5 to 95% by weight, based on the amount of DPP polymer of formula I, or II and compound of formula VI.

$A^3$, $A^4$ and $A^5$ are independently of each other a bivalent group of formula

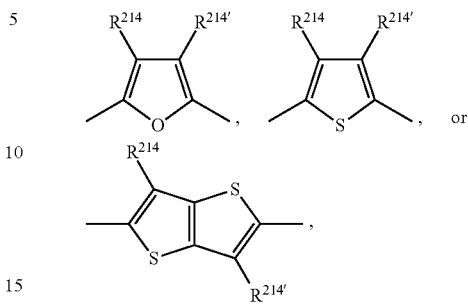

$A^3$ is preferably a group of formula

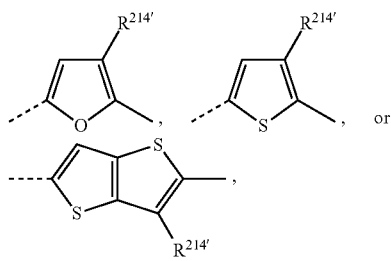

(the dotted line represent the bond to the DPP basic unit). More preferably $A^3$ is a group of formula

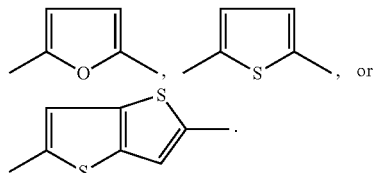

Most preferred $A^3$ is a group of formula

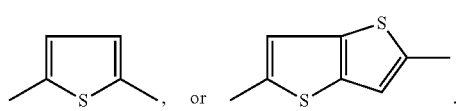

$A^3$ and $A^4$ are preferably a group of formula

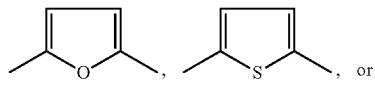

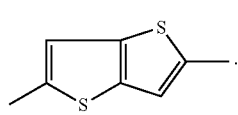

More preferably A³ and A⁴ are a group of formula

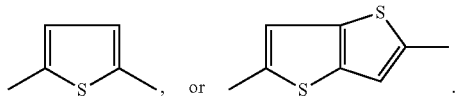

R³ is preferably hydrogen, cyano,

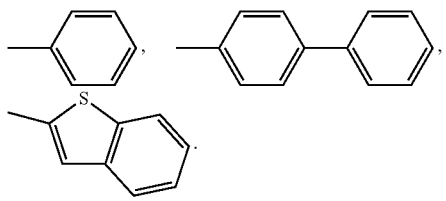

The compound of formula VI is preferably a compound of formula

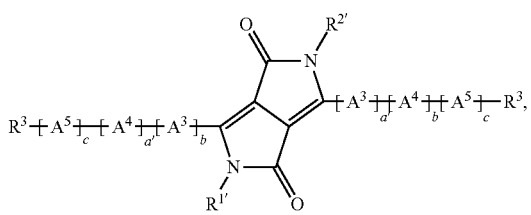

(VIa)

wherein
a' is 1, or 2; b is 0, or 1; c is 0, or 1;
$R^{1'}$ and $R^{2'}$ are the same or different and are a $C_1$-$C_{38}$alkyl group,
A³, A⁴ and A⁵ are independently of each other a bivalent group of formula

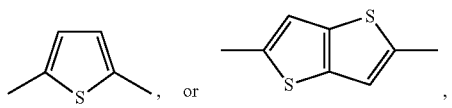

R³ is hydrogen, cyano

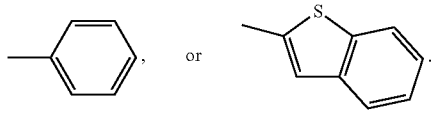

Examples of compounds of formula VI are shown below:

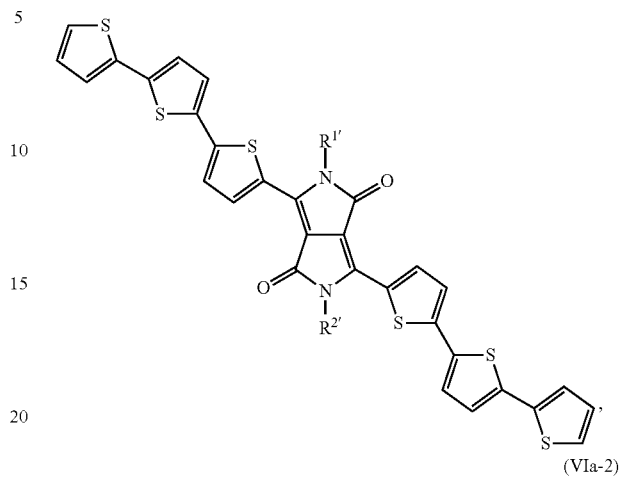

(VIa-1)

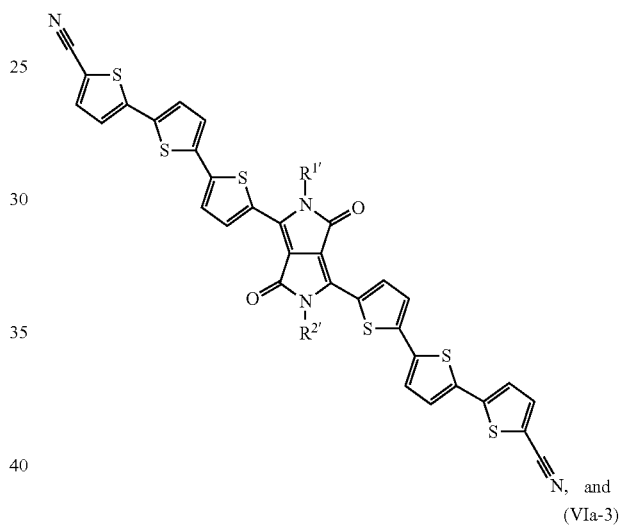

(VIa-2)

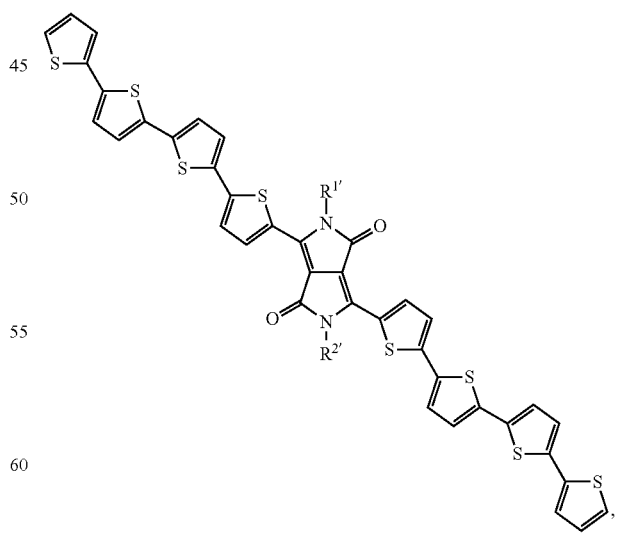

(VIa-3)

wherein $R^{1'}$ and $R^{2'}$ are the same and are a $C_1$-$C_{38}$alkyl group.
$R^{1'}$ and $R^{2'}$ are a $C_1$-$C_{38}$alkyl group, preferably a $C_4$-$C_{24}$alkyl group, more preferably a $C_8$-$C_{24}$alkyl group, such as, for example, n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. The $C_1$-$C_{38}$alkyl, $C_4$-$C_{24}$alkyl group and $C_8$-$C_{24}$alkyl group can be linear, or branched, but are preferably branched. Preferably $R^{1'}$ and $R^{2'}$ have the same meaning. Advantageously, the groups $R^{1'}$ and $R^{2'}$ can be represented by formula

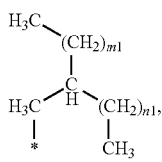

wherein m1=n1+2 and m1+n1≤24. Chiral side chains, such as $R^{1'}$ and $R^{2'}$ can either be homochiral, or racemic, which can influence the morphology of the compounds.

Compounds of formula (VI) and their synthesis are, for example, described in WO2009/047104 and WO2012/041849.

The at present most preferred compound of formula VI is a compound of formula

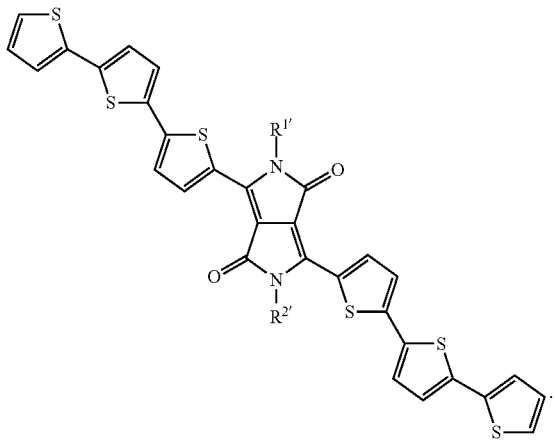

(VIa-1)

Said derivative is particularly good at doping the DPP polymer, binding to source/drain electrodes, and providing a good solubility in common solvents.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like. Due to its ambi-polarity the material can also be used in Organic Light Emitting Transistors (OLET).

A further aspect of the present invention is an organic semiconductor material, layer or component comprising one or more polymers of the present invention. A further aspect is the use of the polymers or materials of the present invention in an organic photovoltaic (PV) device (solar cell), a photodiode, or an organic field effect transistor (OFET). A further aspect is an organic photovoltaic (PV) device (solar cell), a photodiode, or an organic field effect transistor (OFET) comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:
a source electrode,
a drain electrode,
a gate electrode,
a semiconducting layer,
one or more gate insulator layers, and
optionally a substrate, wherein the semiconductor layer comprises a polymer according to the present invention, or an organic semiconductor material, layer or component according to the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the skilled in the art and are described in the literature, for example in WO03/052841.

Typically the semiconducting layer of the present invention is at most 1 micron (=1 μm) thick, although it may be thicker if required. For various electronic device applications, the thickness may also be less than about 1 micron. For example, for use in an OFET the layer thickness may typically be 100 nm or less. The exact thickness of the layer will depend, for example, upon the requirements of the electronic device in which the layer is used.

The insulator layer (dielectric layer) generally can be an inorganic material film or an organic polymer film. Illustrative examples of inorganic materials suitable as the gate dielectric layer include silicon oxide, silicon nitride, aluminum oxide, barium titanate, barium zirconium titanate and the like. Illustrative examples of organic polymers for the gate dielectric layer include polyesters, polycarbonates, poly(vinyl phenol), polyimides, polystyrene, poly(methacrylate)s, poly(acrylate)s, epoxy resin, photosensitive resists as described in WO07/113107 and the like. In the exemplary embodiment, a thermally grown silicon oxide ($SiO_2$) may be used as the dielectric layer.

The thickness of the dielectric layer is, for example from about 10 nanometers to about 2000 nanometers depending on the dielectric constant of the dielectric material used. A representative thickness of the dielectric layer is from about 100 nanometers to about 500 nanometers. The dielectric layer may have a conductivity that is for example less than about $10^{-12}$ S/cm.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont), or Fluoropel® (from Cytonix) or the perfluorosolvent FC 43® (Acros, No. 12377).

In order to form the organic active layer using the DPP polymer of formula I, or II, a composition for the organic active layer including chloroform or chlorobenzene may be used. Examples of the solvent used in the composition for the organic active layer may include chloroform, chlorobenzene, dichlorobenzene, trichlorobenzene, toluene, xylene, methylnaphthalene, mesithylene, indane, tetraline, decaline, or mixtures thereof. Examples of the process of forming the organic active layer may include, but may not be limited to, screen printing, printing, spin coating, slot-die coating, dipping or ink jetting.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer, and crosslinking of the underlying layer. The thickness of the insulating layer is preferably less than 2 micrometers, more preferably less than 500 nm.

In the gate electrode and the source/drain electrodes included in the OFET of the present invention, a typical metal may be used, specific examples thereof include, but are not limited to, platinum (Pt), palladium (Pd), gold (Au), silver (Ag), copper (Cu), aluminum (Al), nickel (Ni). Alloys and oxides, such as molybdenum trioxide and indium tin oxide (ITO), may also be used. Preferably, the material of at least one of the gate, source and drain electrodes is selected from the group Cu, Ag, Au or alloys thereof. The source and drain electrodes may be deposited by thermal evaporation and patterned using standard photolithography and lift off techniques as are known in the art.

The substrate may be rigid or flexible. Rigid substrates may be selected from glass or silicon and flexible substrates may comprise thin glass or plastics such as poly(ethylene terephthalate) (PET), polyethylenenaphthalate (PEN), polycarbonate, polycarbonate, polyvinylalcohol, polyacrylate, polyimide, polynorbornene, and polyethersulfone (PES).

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques.

The source and drain electrodes are preferably formed from the same material for ease of manufacture. However, it will be appreciated that the source and drain electrodes may be formed of different materials for optimisation of charge injection and extraction respectively.

Typical thicknesses of source and drain electrodes are about, for example, from about 40 nanometers to about 1 micrometer with the more specific thickness being about 100 to about 400 nanometers.

The length of the channel defined between the source and drain electrodes may be up to 500 microns, but preferably the length is less than 200 microns, more preferably less than 100 microns, most preferably less than 20 microns.

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. Exemplary materials for such a monolayer include chloro- or alkoxy-silanes with long alkyl chains, eg octadecyltrichlorosilane.

The method of manufacturing the organic thin film transistor may comprise: depositing a source and drain electrode; forming a semiconductive layer on the source and drain electrodes, the semiconductive layer comprising the DPP polymer and the acceptor compound in a channel region between the source and drain electrode. The organic semi-conductive material is preferably deposited from solution. Preferred solution deposition techniques include spin coating and ink jet printing. Other solution deposition techniques include dip-coating, roll printing and screen printing.

A bottom-gate OFET device may be formed using the method illustrated below.

1. Gate deposition and patterning (e.g. patterning of an ITO-coated substrate).
2. Dielectric deposition and patterning (e.g. cross-linkable, photopatternable dielectrics).
3. Source-drain material deposition and patterning (e.g. silver, photolithography).
4. Source-drain surface treatment. The surface treatment groups could be applied by dipping the substrate into a solution of the self-assembled material, or applying by spin coating from a dilute solution. Excess (un-attached) material can be removed by washing.
5. Deposition of the organic semiconductive material (e.g. by ink jet printing).

This technique is also compatible with top-gate devices. In this case, the source-drain layer is deposited and patterned first. The surface treatment is then applied to the source-drain layer prior to organic semiconductive material, gate dielectric and gate deposition.

OFETs have a wide range of possible applications. One such application is to drive pixels in an optical device (apparatus), preferably an organic optical device. Examples of such optical devices include photoresponsive devices, in particular photodetectors, and light-emissive devices, in particular organic light emitting devices. High mobility OTFTs are particularly suited as backplanes for use with active matrix organic light emitting devices, e.g. for use in display applications.

The polymers of the present invention may be used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor.

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3. The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, $TiO_2$, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

A so called 'tandem solar cell' comprise in this order:
(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The PV device can also be processed on a fiber as described, for example, in US20070079867 and US 20060013549.

Due to their excellent self-organising properties the materials or films comprising the polymers of the present invention can also be used alone or together with other materials in or as alignment layers in LCD or OLED devices, as described for example in US2003/0021913.

The following examples are included for illustrative purposes only and do not limit the scope of the claims. Unless otherwise stated, all parts and percentages are by weight. Weight-average molecular weight (Mw) and polydispersity (Mw/Mn=PD) are determined by Heat Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 ìm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 ìl; Detection: RI, Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i.e., PS 1'930'000, PS 1'460'000, PS 1'075'000, PS 560'000, PS 330'000, PS 96'000, PS 52'000, PS 30'300, PS 10'100, PS 5'050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES
Example 1
a) Polymer Preparation
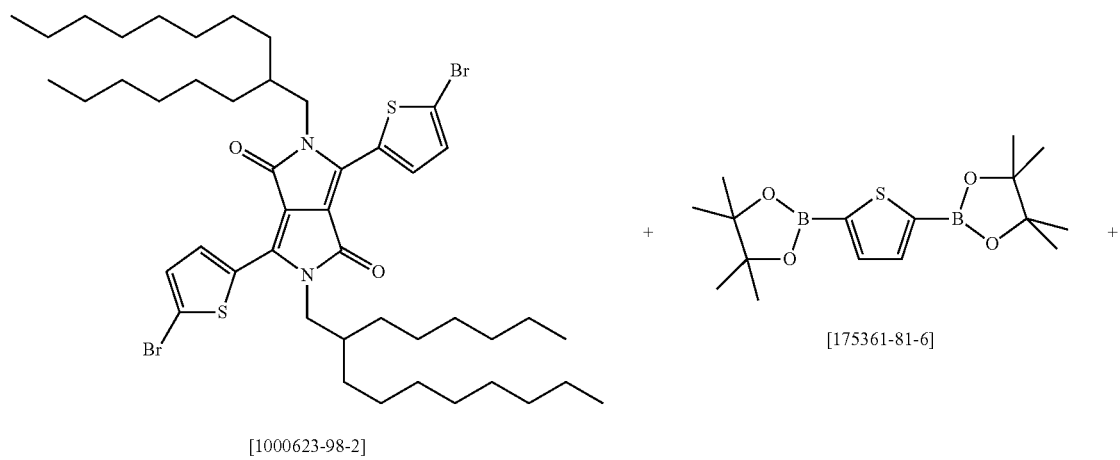
[1000623-98-2]
[175361-81-6]
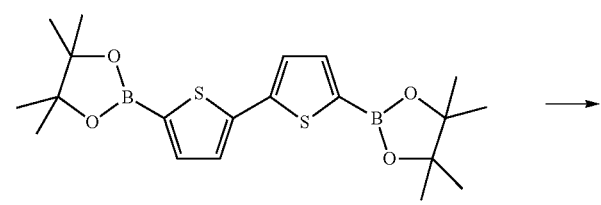
[239075-02-6]
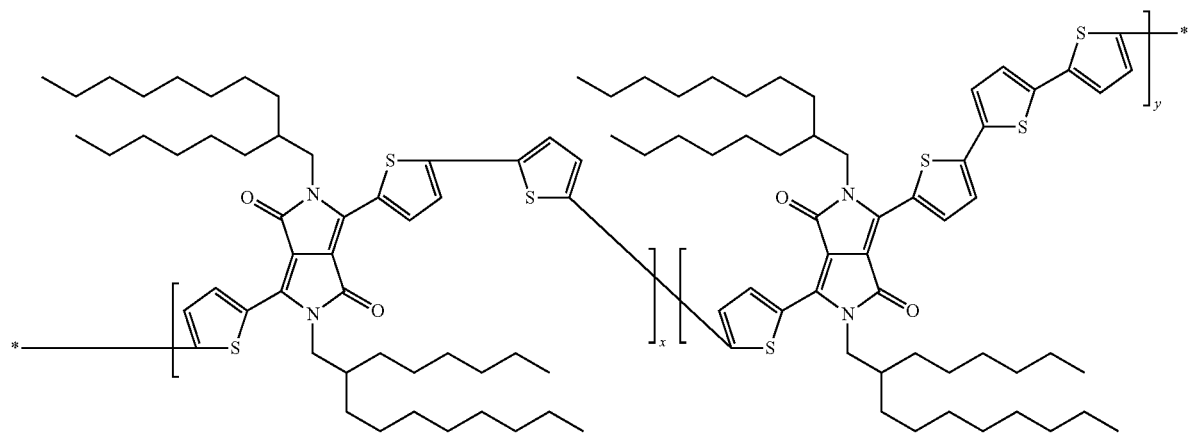
P-1

4.021 g (1 equivalent) of the dibromo compound [1000623-98-2], 1.204 g (0.8 equivalents) of the diboronicacidester [175361-81-6], 0.368 g (0.2 equivalents) of the diboronicacidester [239075-02-6], 0.0395 g of palladium(II) acetate and 0.202 g of the phosphine ligand,

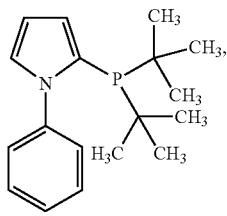

[672937-61-0]

are dissolved under argon in degassed tetrahydrofurane in a reactor at reflux. Then 1.13 g of LiOH monohydrate [1310-66-3] are added and the reaction mixture is refluxed for another 2 hours. The reaction mixture is then poured on methanol, filtered and washed with methanol. The filter cake is then fractionated via Soxhlet extraction, first with n-heptane, then with cyclohexane and finally with tetrahydrofurane. The product is precipitated out of the tetrahydrofurane fraction with acetone, filtered and washed with acetone. The product is then dissolved in chloroform and refluxed together with a 5% NaCN solution in water overnight. The phases are separated and the chloroform solution is washed three times with water and the product is then precipitated out of the chloroform solution with methanol to give the polymer of the formula P-1 (x:y=80:20). The polymer is characterized by high-temperature GPC and the molecular weight is 54700 with a Mw/Mn ratio of 2.

b) Solution Preparation

Then a solution (Sol-1) is prepared in dissolving 0.75% of the polymer P-1 in toluene. After 2 hours stirring at 40° C. Sol-1 is filtered with a 0.45 micron filter.

c) Preparation of the Organic Field Effect Transistor (OFET; Top Gate Bottom Contact)

c1) Substrate Preparation

A flexible foil of polyethylene terephthalate (PET) (Mitsubishi Hostaphan GN) is coated with a 30 nm thick layer of gold. Interdigited electrodes are made by photolithography on the gold layer. The channel width L is 10 microns and its length W is 10000 microns leading to a W/L ratio of 1000. The substrate is then carefully cleaned with acetone and isopropanol in order to remove any remaining trace of photoresist employed to make the electrodes.

c2) Organic Semiconductor Layer

The semiconductor solution Sol-1 is spin coated on the cleaned flexible substrate. Then the film is dried 30 seconds on a hot plate at 90° C. in air. The spin conditions (rpm 1500 during 15 seconds) are such that the thickness of the semiconductor film after drying is 50+/−5 nm (thickness measured with a Dektak 6M (from Veeco).

c3) Dielectric Layer

The dielectric solution is a 4% butyl acetate/ethyl lactate (60/40) solution of polymethyl methacrylate (PMMA) 950K (1004084 from Allresist). The dielectric solution is applied on the dried semiconductor layer by spin coating (rpm=1800 during 30 seconds) giving a thickness of 500 nm+/−10 nm (after drying). The dielectric layer is dried 2 minutes at 90° C. in air. The capacitance of the dielectric film is 5.8±0.2 nF/cm².

c4) Gate

The gate electrode is made by thermal evaporation of 50 nm gold on the dielectric. The evaporation is made under high vacuum (<10$^{-5}$ Torr).

c5) OFET Measurements

The saturation transfer curves of OFET were measured with a Keithley 2612A source meter. The observed saturation hole mobility (average of 42 OFETs) at a gate voltage of −15 V of 0.11+/−0.004 cm²/sec*V (Drain voltage set at −20 V) and a subthreshold swing of then 1 V/dec.

The polymer P-1 has excellent solubility in organic solvents and excellent film-forming properties. The OFET of Application Example 1, where the semiconductor layer consists of polymer P-1, shows excellent processibility (reproduceability), hole mobility and subthreshold swing.

Example 2 to 5 and Comparative Examples 1 to 4 a) Polymer Preparation

Polymers P-2 to P-9 are prepared as described for polymer P-1 in Example 1a), except that the ratio of diboronicacidester [175361-81-6] and diboronicacidester [239075-02-6] is changed, accordingly.

b) Solution Preparation

Then a solution is prepared by dissolving 0.75% of the respective polymer in toluene. After 2 hours stirring at 40° C. the solution is filtered with a 0.45 micron filter, whereby a semiconductor solution is obtained.

c) Preparation of the Organic Field Effect Transistor (OFET; Top Gate Bottom Contact)

c1) Substrate Preparation:

A flexible foil of polyethylene terephthalate (PET) (Mitsubishi Hostaphan GN) is coated with a 30 nm thick layer of gold. Interdigitated electrodes are made by photolithography on the gold layer. The channel width L is 10 microns and its length W is 10000 microns leading to a W/L ratio of 1000. The substrate is then carefully cleaned with acetone and isopropanol in order to remove any remaining trace of photoresist employed to make the electrodes.

c2) Organic Semiconductor Layer

The semiconductor solution is spin coated on the cleaned flexible substrate. Then the film is dried 30 seconds on a hot plate at 90° C. in air. The spin coating conditions are such that the thickness of the semiconductor film after drying is 50+/−5 nm (thickness measured with a Dektak 6M (from Veeco)).

c3) Dielectric Layer

The dielectric solution is a 4% butyl acetate/ethyl lactate (60/40) solution of PMMA 950K (1004084 from Allresist). The dielectric solution is applied on the dried semiconductor layer by spin coating (rpm=1800 during 30 seconds) giving a thickness of 500 nm+/−10 nm (after drying). The dielectric layer is dried 2 minutes at 90° C. in air. The capacitance of the dielectric film is 5.8±0.1 nF/cm².

c4) Gate

The gate electrode is made by thermal evaporation of 50 nm gold on the dielectric. The evaporation is made under high vacuum (<$10^{-5}$ Torr).

c5) OFET Measurements

The saturation transfer curves of the OFETs obtained in Examples 2 to 5 and Comparative Examples 1 to 4 are measured with a Keithley 2612A source meter. The observed hole mobility is an average of 42 OFETs calculated from saturation transfer curves with drain voltage=−20 V at a gate voltage of −15 V. The hole mobility of the OFETs obtained in Examples 2 to 5 and Comparative Examples 1 to 4 using polymers P-2 to P-9 as semiconductors as well as x, $M_w$, $M_n$ and $M_w/M_n$ of polymers P-2 to P-9 are shown in the Table below

|  | Polymer | x[1] | $M_w$ | $M_w/M_n$ | Hole Mobility cm$^2$/sec*V |
|---|---|---|---|---|---|
| Example 2 | P-2 | 0.98 | 40400 | 2.06 | 0.13 ± 0.10 |
| Example 3 | P-3 | 0.95 | 70400 | 2.38 | 0.13 ± 0.10 |
| Example 4 | P-4 | 0.90 | 35800 | 1.94 | 0.10 ± 0.10 |
| Example 5 | P-5 | 0.80 | 54700 | 2.00 | 0.10 ± 0.05 |
| Comp. Example 1 | P-6 | 1 | 53000 | 2.05 | 0.20 ± 0.12 |
| Comp. Example 2 | P-7 | 0.60 | 44000 | 1.63 | 0.05 ± 0.02 |
| Comp. Example 3 | P-8 | 0.40 | 30300 | 1.68 | 0.05 ± 0.02 |
| Comp. Example 4 | P-9 | 0 | 12100 | 1.74 | 0.01 |

[1] (x + y = 1).
[2] $M_w$ = weight average molecular weight. $M_n$ = number average molecular weight.

The mobility of the OFETs obtained in Comparative Examples 2 and 3, wherein polymers P-7 (x=0.60), P-8 (x=0.40) and P-9 (x=0), are used as semiconductors, is lower than the mobility of the OFETs obtained in Examples 2 to 5, where polymers with x=0.70 to 0.99 are used as semiconductors. The standard deviation of mobility of the OFET obtained in Comparative Example 1, wherein polymer P-6 (x=1) is used as semiconductor, is higher than the standard deviation of the mobility of the OFETs obtained in Examples 2 to 5, where polymers with x=0.70 to 0.99 are used as semiconductors (higher reproducibility). The value for x=0.8 (y=0.2) corresponds to the best compromise regarding the smallest standard deviation (highest reproducibility) for the highest mobility.

Example 6 a) Substrate Preparation

A flexible foil of polyethylene terephthalate (PET) (Mitsubishi Hostaphan GN) is coated with a 30 nm thick layer of gold. Interdigitated electrodes are made by photolithography on the gold layer. The channel width L is 10 microns and its length W is 10000 microns leading to a W/L ratio of 1000. The substrate is then carefully cleaned with acetone and isopropanol in order to remove any remaining trace of photoresist employed to make the electrodes.

b) Solution Preparation

Solution A: 0.75% of polymer

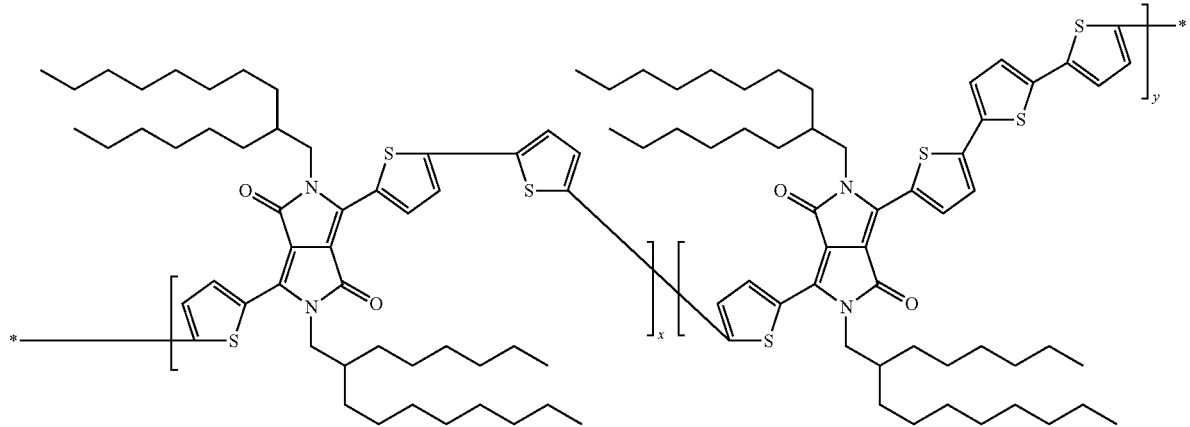

(P-10, $M_w$: 60700; x=0.80, y=0.20 are dissolved in toluene during 4 hours at 80° C.

Solution B: 0.75% of compound (A-1)

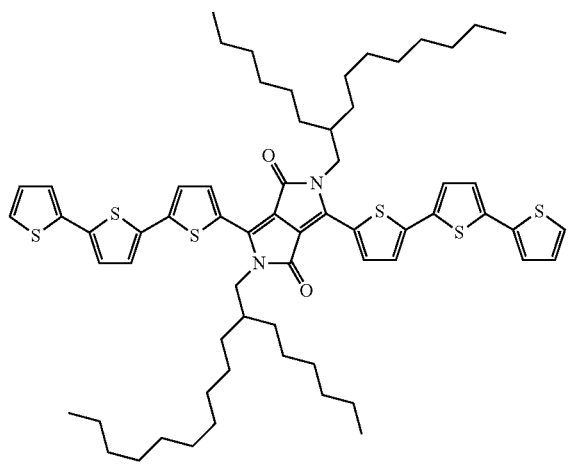

are dissolved in a mixture of toluene and chloroform (95:5) during 2 hours at 50° C. 5% by weight of solution B are mixed with 95% by weight of solution A (=semiconductor solution).

c) OFET Preparation (Top Gate Bottom Contact)

c1) Organic Semiconductor Layer

The semiconductor solution is doctor blated in air (clean room) on the cleaned flexible substrate. Then the film is dried 30 seconds on a hot plate at 90° C. in air. The blading conditions are such that the thickness of the semiconductor film after drying is 60±5 nm (thickness measured with a Dektak 6M (from Veeco).

c2) Dielectric Layer

The dielectric solution is a Cytop solution (AGC CE (Asahi Glass Chemical), CYTOP CT-809M). The dielectric solution is applied on the dried semiconductor layer by spin coating (rpm=1800 during 30 seconds) giving a thickness of 500 nm±10 nm (after drying). The dielectric layer is dried 2 minutes at 90° C. in air. The capacitance of the dielectric film is 3.8±0.02 nF/cm².

c3) Gate

The gate electrode is made by thermal evaporation of 50 nm gold on the dielectric. The evaporation is made under high vacuum (<$10^{-5}$ Torr).

d) OFET Measurements

The saturation transfer curves of OFET are measured with a Keithley 2612A source meter. The observed hole mobility (average of 42 OFETs calculated from saturation transfer curves with drain voltage=−20 V) at a gate voltage of −15 V is 0.75±0.03 cm²/sec*V and a subthreshold swing of less than 0.6 V/DEC. The subthreshold swing (the lower the better) is an indication of the concentration of the trapping state at the dielectric/semiconductor interface. At best, at room temperature, it can be 60 mV/dec.

Comparative Example 5

Example 7 is repeated, except that polymer P-10 instead of polymer P-10 and compound A-1 forms the semiconductive layer which results in a mobility of 0.5±0.05 cm²/sec*V with a subthreshold swing of less than 0.7 V/DEC.

The invention claimed is:

1. A polymer of formula

 (I)

 (II)

wherein
x=0.70 to 0.99,
y=0.30 to 0.01, and wherein
x+y=1,
r+s=0.50 to 0.99, t+u=0.50 to 0.01, and wherein r+s+t+u=1,
A is a group of formula

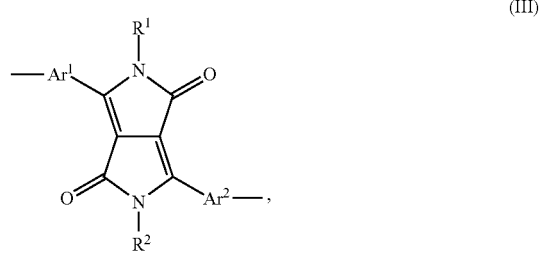 (III)

wherein $R^1$ and $R^2$ may be the same or different and are each independently hydrogen, a $C_1$-$C_{38}$alkyl group, a $C_2$-$C_{38}$alkenyl group, a $C_3$-$C_{38}$alkinyl group, each are optionally interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group optionally substituted one or more times by $C_1$-$C_{25}$alkyl, $C_1$-$C_8$alkoxy, halogen or cyano;

$Ar^1$ and $Ar^2$ are each independently

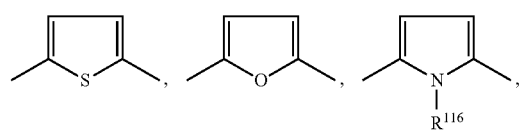

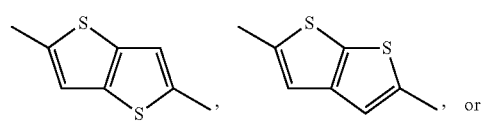, or

,

B is a group of formula III, which is different from A,
D is Ar$^1$,

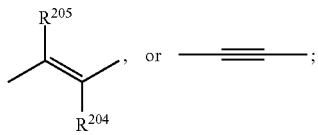

R$^{204}$ and R$^{205}$ are each independently H, CN, COOR$^{206}$ or C$_1$-C$_8$alkyl;
R$^{206}$ is a C$_1$-C$_{18}$alkyl group;
E is a group of formula

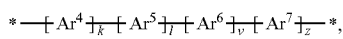

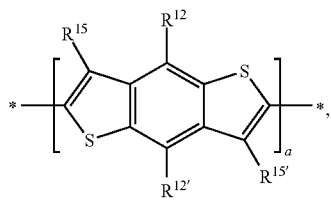

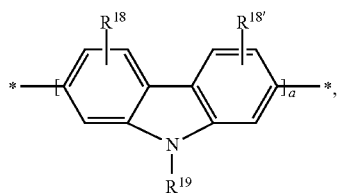

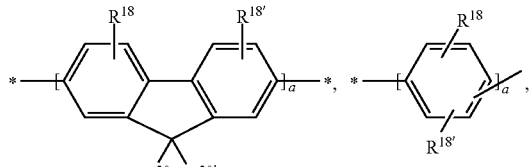

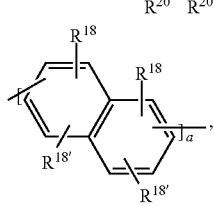

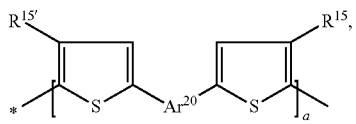

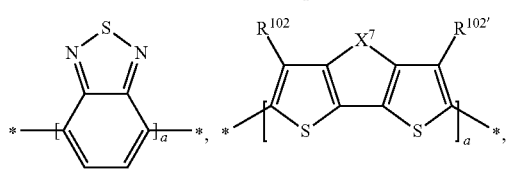

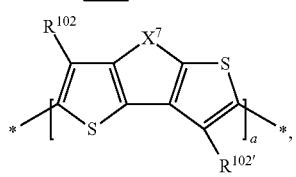

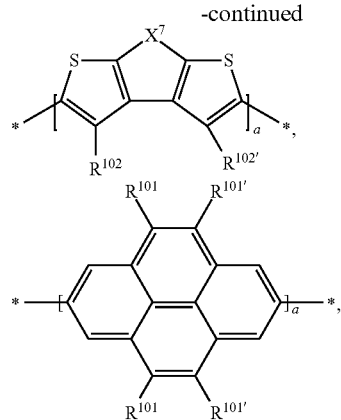

which is different from D, wherein
k is 1,
l is 0, or 1,
v is 0, or 1,
z is 0, or 1,
a is an integer of 1 to 5,
Ar$^4$, Ar$^5$, Ar$^6$ and Ar$^7$ are each independently a group of formula

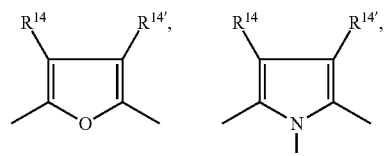

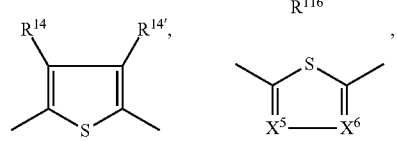

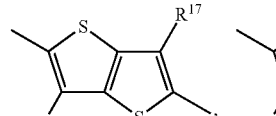

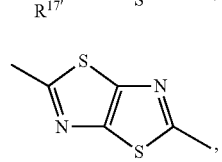

wherein one of X$^5$ and X$^6$ is N and the other is CR$^{14}$,
Ar$^{20}$ is an arylene group, or a heteroarylene group, each of which are optionally substituted,
R$^{12}$ and R$^{12'}$ are each independently hydrogen, halogen, C$_1$-C$_{25}$alkyl, optionally interrupted by one, or more oxygen or sulphur atoms, C$_1$-C$_{25}$alkoxy, C$_7$-C$_{25}$arylalkyl, or

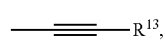

R$^{13}$ is a C$_1$-C$_8$alkyl group, or a tri(C$_1$-C$_8$alkyl)silyl group,
R$^{14}$, R$^{14'}$, R$^{15}$, R$^{15'}$, R$^{17}$ and R$^{17'}$ are each independently H, or a C$_1$-C$_{25}$alkyl group, optionally interrupted by one or more oxygen atoms;

$R^{18}$ and $R^{18'}$ are each independently hydrogen, halogen, $C_1$-$C_{25}$alkyl, optionally interrupted by one or more oxygen or sulphur atoms, $C_7$-$C_{25}$aralkyl, or $C_1$-$C_{25}$alkoxy;

$R^{19}$ is hydrogen, $C_7$-$C_{25}$aralkyl, $C_6$-$C_{18}$aryl; $C_6$-$C_{18}$aryl substituted by $C_1$-$C_{18}$alkyl, or $C_1$-$C_{18}$alkoxy; or $C_1$-$C_{25}$alkyl, optionally interrupted by one or more oxygen or sulphur atoms;

$R^{20}$ and $R^{20'}$ are each independently hydrogen, $C_7$-$C_{25}$aralkyl, $C_1$-$C_{25}$alkyl, optionally interrupted by one or more oxygen or sulphur atoms, $X^7$ is —O—, —S—, —$NR^{115}$—, —$Si(R^{117})(R^{117'})$—, —$C(R^{120})(R^{120'})$—, —$C(\!\!=\!\!O)$—,

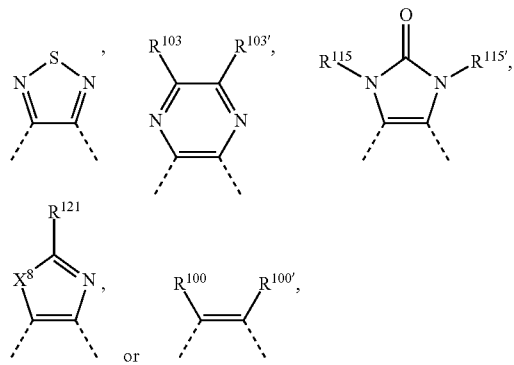

$X^8$ is —O—, or —$NR^{115}$—;

$R^{100}$ and $R^{100'}$ are each independently H, F, $C_1$-$C_{18}$alkyl, $C_1$-$C_{18}$alkyl interrupted by O, $C_1$-$C_{18}$alkoxy, $C_1$-$C_{18}$alkoxy interrupted by O, $C_1$-$C_{18}$perfluoroalkyl, $C_6$-$C_{24}$aryl, optionally substituted one to three times with $C_1$-$C_8$alkyl and/or $C_1$-$C_8$alkoxy, $C_2$-$C_{20}$heteroaryl, optionally substituted one to three times with $C_1$-$C_8$alkyl and/or $C_1$-$C_8$alkoxy;

$R^{101}$ and $R^{101'}$ are each independently H, F, $C_1$-$C_{18}$alkyl, $C_1$-$C_{18}$alkyl interrupted by O, $C_1$-$C_{18}$alkoxy, $C_1$-$C_{18}$alkoxy interrupted by O, $C_1$-$C_{18}$perfluoroalkyl, $C_6$-$C_{24}$aryl, optionally substituted one to three times with $C_1$-$C_8$alkyl and/or $C_1$-$C_8$alkoxy, $C_2$-$C_{20}$heteroaryl, optionally substituted one to three times with $C_1$-$C_8$alkyl and/or $C_1$-$C_8$alkoxy;

$R^{102}$ and $R^{102'}$ are each independently H, halogen, $C_1$-$C_{25}$alkyl, optionally interrupted by one or more oxygen or sulphur atoms; $C_7$-$C_{25}$arylalkyl, or $C_1$-$C_{25}$alkoxy;

$R^{103}$ and $R^{103'}$ are each independently hydrogen, halogen, $C_1$-$C_{25}$alkyl, optionally interrupted by one or more oxygen or sulphur atoms; $C_6$-$C_{24}$aryl, optionally substituted one to three times with $C_1$-$C_8$alkyl and/or $C_1$-$C_8$alkoxy; $C_7$-$C_{25}$arylalkyl, CN, or $C_1$-$C_{25}$alkoxy; or $R^{103}$ and $R^{103'}$ together form a ring, $R^{115}$ and $R^{115'}$ are each independently hydrogen, $C_6$-$C_{18}$aryl; $C_6$-$C_{18}$aryl substituted by $C_1$-$C_{18}$alkyl, or $C_1$-$C_{18}$alkoxy; $C_1$-$C_{25}$alkyl, optionally interrupted by one or more oxygen or sulphur atoms; or $C_7$-$C_{25}$arylalkyl, $R^{116}$ is hydrogen, $C_7$-$C_{25}$arylalkyl, $C_6$-$C_{18}$aryl; $C_6$-$C_{18}$aryl substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl interrupted by —O—, or —S—; or —$COOR^{119}$; $R^{119}$ is $C_1$-$C_{38}$alkyl;

$R^{117}$ and $R^{117'}$ are each independently $C_1$-$C_{35}$alkyl group, $C_7$-$C_{25}$arylalkyl, or a phenyl group, optionally substituted one to three times with $C_1$-$C_8$alkyl and/or $C_1$-$C_8$alkoxy, $R^{120}$ and $R^{120'}$ are each independently hydrogen, $C_1$-$C_{38}$alkyl, optionally interrupted by one, or more oxygen, or sulphur atoms; or $C_7$-$C_{25}$arylalkyl, and $R^{121}$ is H, $C_1$-$C_{18}$alkyl, optionally interrupted by one or more oxygen or sulphur atoms, $C_1$-$C_{18}$perfluoroalkyl, $C_6$-$C_{24}$aryl, optionally substituted one to three times with $C_1$-$C_8$alkyl and/or $C_1$-$C_8$alkoxy; $C_2$-$C_{20}$heteroaryl, optionally substituted one to three times with $C_1$-$C_8$alkyl and/or $C_1$-$C_8$alkoxy; or CN.

2. The polymer of claim 1, wherein $Ar^1$ and $Ar^2$ are each independently a group of formula

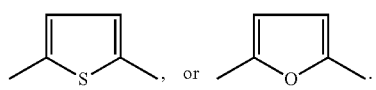

3. The polymer of claim 1, wherein A is a group of formula

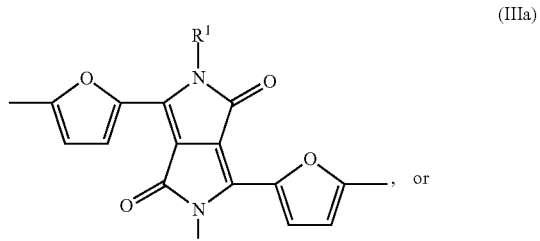

(IIIa)

(IIIb)

wherein $R^1$ and $R^2$ are each independently a $C_1$-$C_{38}$alkyl group.

4. The polymer of claim 1, wherein D is a group of formula

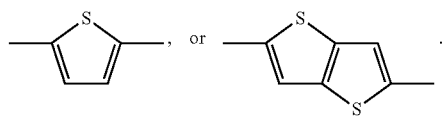

5. The polymer of claim 1, wherein E is a group of formula

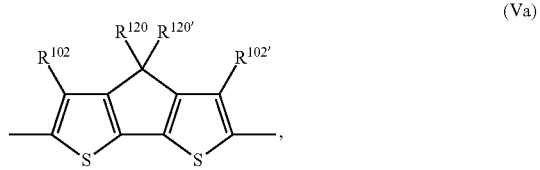

(Va)

-continued

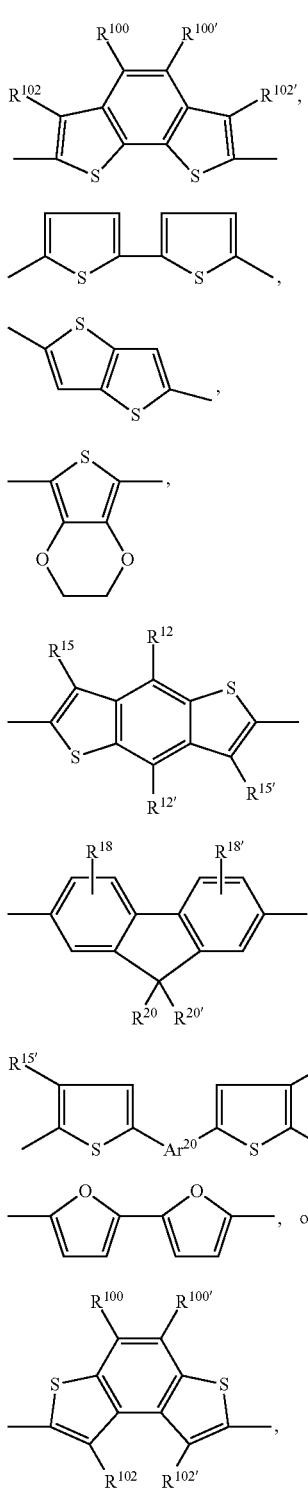

wherein
$R^{100}$ and $R^{100'}$ are each independently H, F, $C_1$-$C_{18}$alkyl, $C_1$-$C_{18}$alkyl interrupted by O, $C_1$-$C_{18}$alkoxy, $C_1$-$C_{18}$alkoxy interrupted by O, $C_1$-$C_{18}$perfluoroalkyl, $C_6$-$C_{24}$aryl, optionally substituted one to three times with $C_1$-$C_8$alkyl and/or $C_1$-$C_8$alkoxy, $C_2$-$C_{20}$heteroaryl, optionally substituted one to three times with $C_1$-$C_8$alkyl and/or $C_1$-$C_8$alkoxy;

$R^{102}$ and $R^{102'}$ are each independently H, halogen, $C_1$-$C_{25}$alkyl, optionally interrupted by one or more oxygen or sulphur atoms; $C_7$-$C_{25}$arylalkyl, or $C_1$-$C_{25}$alkoxy;

$R^{120}$ and $R^{120'}$ are each independently hydrogen, $C_1$-$C_{38}$alkyl, optionally interrupted by one, or more oxygen, or sulphur atoms; or $C_7$-$C_{25}$arylalkyl;

$Ar^{20}$ is an arylene group, optionally substituted, or a heteroarylene group, optionally substituted, $R^{12}$ and $R^{12'}$ are each independently hydrogen, halogen, $C_1$-$C_{25}$alkyl, optionally interrupted by one, or more oxygen, or sulphur atoms, $C_1$-$C_{25}$alkoxy, $C_7$-$C_{25}$arylalkyl, or

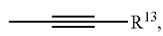

$R^{13}$ is a $C_1$-$C_8$alkyl group, or a tri($C_1$-$C_8$alkyl)silyl group, $R^{15}$ and $R^{15'}$ are each independently H, or a $C_1$-$C_{25}$alkyl group, optionally interrupted by one or more oxygen atoms, $R^{18}$ and $R^{18'}$ are each independently hydrogen, halogen, $C_1$-$C_{25}$alkyl, especially $C_4$-$C_{25}$alkyl, optionally interrupted by one or more oxygen or sulphur atoms, $C_7$-$C_{25}$aralkyl, or $C_1$-$C_{25}$alkoxy; and $R^{20}$ and $R^{20'}$ are each independently hydrogen, $C_7$-$C_{25}$aralkyl, $C_1$-$C_{25}$alkyl, optionally interrupted by one, or more oxygen, or sulphur atoms.

6. The polymer of claim 1, comprising repeating units of the formula

wherein
x=0.70 to 0.99, y=0.30 to 0.01, and wherein x+y=1,
A is a group of formula

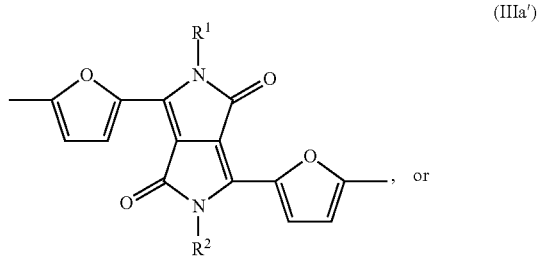

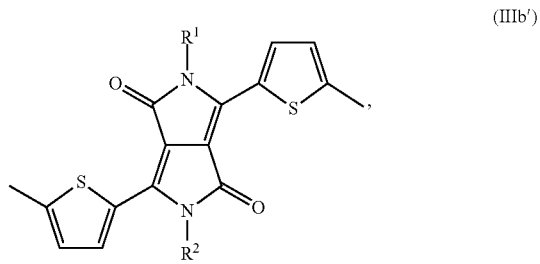

wherein $R^1$ is a $C_1$-$C_{38}$alkyl group,

D is a group of formula

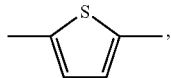

E is a group of formula (Va') 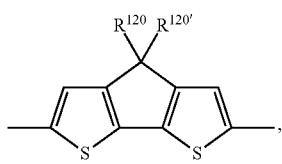

(Vb') 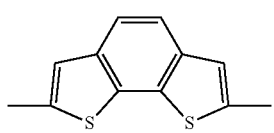

(Vc') 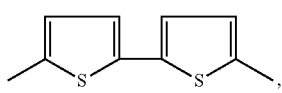

(Vd') 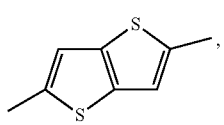

(Vf') 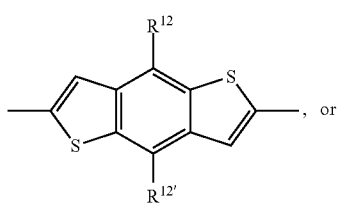, or (Vj') 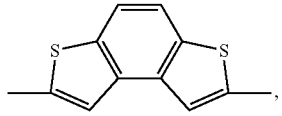

wherein $R^{12}$ and $R^{12'}$ are each independently hydrogen, halogen, $C_1$-$C_{25}$alkyl, optionally interrupted by one, or more oxygen, or sulphur atoms, $C_1$-$C_{25}$alkoxy, $C_7$-$C_{25}$arylalkyl, or

$R^{13}$ is a $C_1$-$C_8$alkyl group, or a tri($C_1$-$C_8$alkyl)silyl group, and $R^{120}$ and $R^{120'}$ are each independently hydrogen, or $C_1$-$C_{38}$alkyl, optionally interrupted by one, or more oxygen, or sulphur atoms.

7. The polymer of claim 1, comprising repeating units of the formula

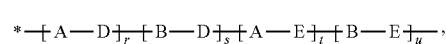 (II)

wherein r+s=0.70 to 0.99, t+u=0.30 to 0.01, and wherein r+s+t+u=1,

A is a group of formula (IIIa') 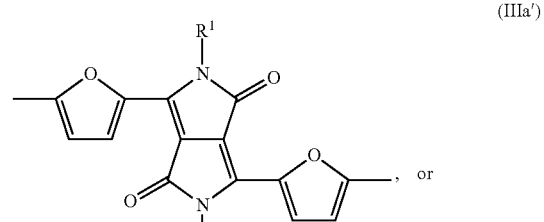, or (IIIb') 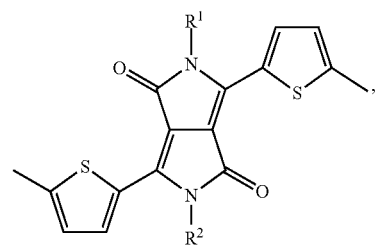

B is a group of formula (IIIa') 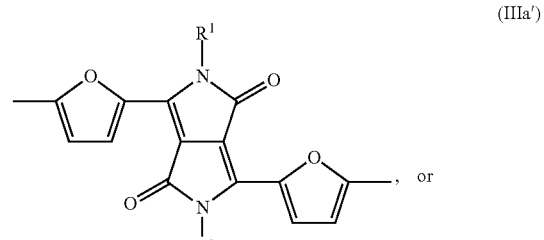, or (IIIb') 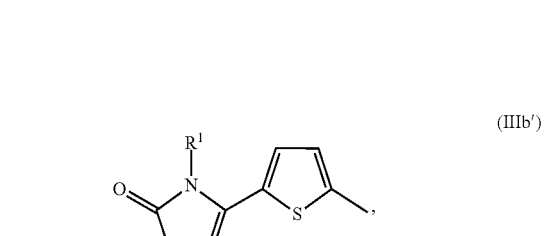

which is different from A, wherein
R$^1$ is a C$_1$-C$_{38}$alkyl group,
D is a group of formula

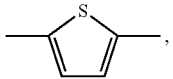

E is a group of formula

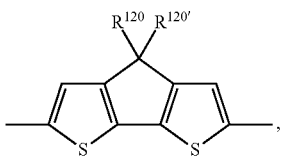 (Va')

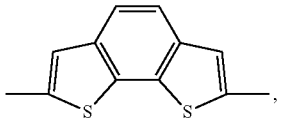 (Vb')

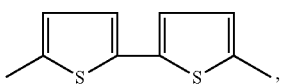 (Vc')

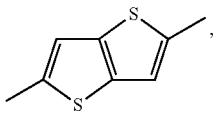 (Vd')

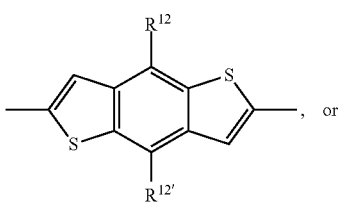 (Vf')

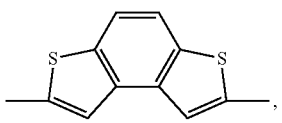 (Vj')

wherein
R$^{12}$ and R$^{12'}$ are each independently hydrogen, halogen, C$_1$-C$_{25}$alkyl, optionally interrupted by one, or more oxygen, or sulphur atoms, C$_1$-C$_{25}$alkoxy, C$_7$-C$_{25}$arylalkyl, or

R$^{13}$ is a C$_1$-C$_8$alkyl group, or a tri(C$_1$-C$_8$alkyl)silyl group, and
R$^{120}$ and R$^{120'}$ are each independently hydrogen, or C$_1$-C$_{38}$alkyl, optionally interrupted by one, or more oxygen, or sulphur atoms.

8. The polymer of claim 1, which is a polymer of formula (Ia)

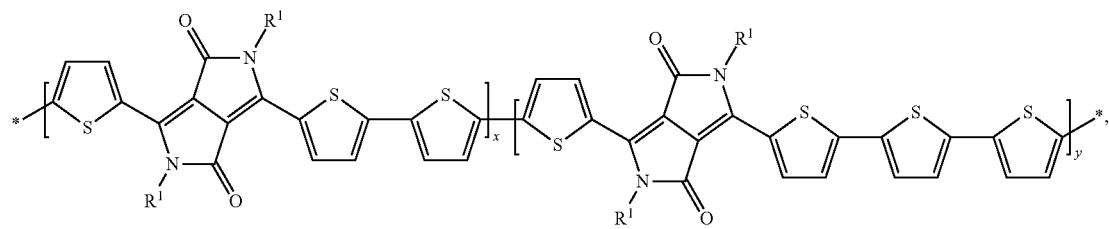

wherein
x=0.70 to 0.99,
y=0.30 to 0.01, and wherein
x+y=1,
R$^1$ is a C$_2$-C$_{24}$alkyl group.

9. An organic semiconductor material, layer or component, comprising
(a) the polymer of claim 1, and
(b) optionally at least another material.

10. The organic semiconductor material, layer or component of claim 9, wherein the other material is a compound of formula

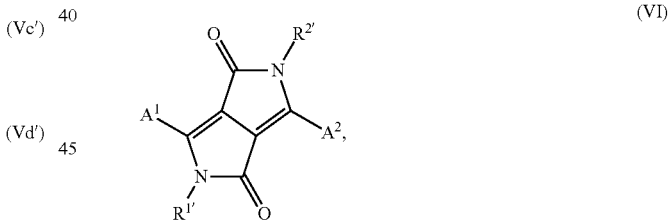 (VI)

wherein
A$^1$ and A$^2$ are independently of each other a group of formula

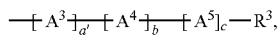

a' is 1, or 2;
b is 0, or 1;
c is 0, or 1;
R$^{1'}$ and R$^{2'}$ may be the same or different and are each independently hydrogen, a C$_1$-C$_{38}$alkyl group, a C$_2$-C$_{38}$alkenyl group, a C$_3$-C$_{38}$alkinyl group, each of which are optionally interrupted one or more times by —O—, —S— or COO, a C$_7$-C$_{100}$arylalkyl group, which can be substituted one to five times with C$_1$-C$_8$alkyl, C$_1$-C$_8$alkoxy, CF$_3$ and/or F; and a phenyl group optionally substituted one or more times by $C_1$-$C_{25}$alkyl, $C_1$-$C_8$alkoxy, halogen or cyano;

$A^3$, $A^4$ and $A^5$ are each independently a bivalent group of formula

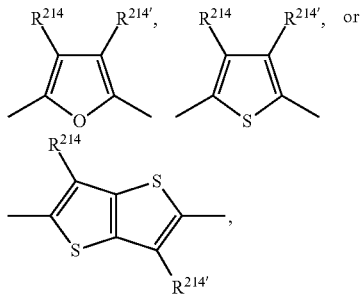

$R^{214}$ and $R^{214'}$ are each independently hydrogen, halogen, halogenated $C_1$-$C_{25}$alkyl, especially $CF_3$, cyano, $C_1$-$C_{25}$alkyl, optionally interrupted by one or more oxygen or sulphur atoms; $C_7$-$C_{25}$arylalkyl, or $C_1$-$C_{25}$alkoxy;

$R^3$ is hydrogen, halogen, cyano, $C_1$-$C_{25}$alkyl,

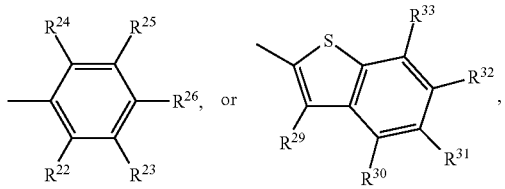

, wherein $R^{22}$ to $R^{25}$ and $R^{29}$ to $R^{33}$ are each independently H, halogen, cyano, or $C_1$-$C_{25}$alkyl, and $R^{26}$ is H, halogen, cyano, phenyl, or $C_1$-$C_{25}$alkyl.

11. A semiconductor device, comprising the polymer of claim 1.

12. The semiconductor device of claim 11, wherein the semiconductor device is a device selected from the group consisting of an organic photovoltaic device, a photodiode, and an organic field effect transistor.

13. A process for the preparation of an organic semiconductor device, the process comprising:

applying a solution and/or dispersion of the polymer of claim 1 in an organic solvent to a suitable substrate; and removing the solvent.

14. A photovoltaic device, a photodiode, or an organic field transistor comprising the polymer of claim 1.

15. A process for the preparation of a polymer of formula

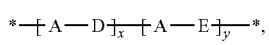

comprising reacting a dihalogenide comprising a formula $X^{11'}$-A-$X^{11'}$ with diboronic acids, or diboronates comprising a formulae $X^{11}$-D-$X^{11}$ and $X^{11}$-E-$X^{11}$ in a solvent and in the presence of a catalyst; or comprising reacting a diboronic acid, or a diboronate comprising a formula $X^{11}$-A-$X^{11}$ with dihalogenides comprising a formulae $X^{11'}$-D-$X^{11'}$ and $X^{11'}$-E-$X^{11'}$ in a solvent and in the presence of a catalyst; or a process for the preparation of a polymer of formula

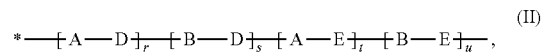

comprising reacting dihalogenides corresponding to formulae $X^{11'}$-A-$X^{11'}$ and $X^{11'}$-B-$X^{11'}$ with diboronic acids, or diboronates comprising a formulae $X^{11}$-D-$X^{11}$ and $X^{11}$-E-$X^{11}$; or comprising reacting diboronic acids, or diboronates comprising a formulae $X^{11}$-A-$X^{11}$ and $X^{11}$-B-$X^{11}$ with dihalogenides comprising a formulae $X^{11'}$-D-$X^{11'}$ and $X^{11'}$-E-$X^{11'}$;

x=0.70 to 0.99,
y=0.30 to 0.01, and wherein
x+y=1,
r+s=0.50 to 0.99,
t+u=0.50 to 0.01, and wherein
r+s+t+u=1, A is a group of formula

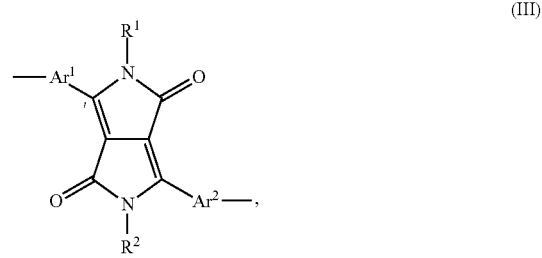

wherein $R^1$ and $R^2$ may be the same or different and are each independently hydrogen, a $C_1$-$C_{38}$alkyl group, a $C_2$-$C_{38}$alkenyl group, a $C_3$-$C_{38}$alkinyl group, each are optionally interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group optionally substituted one or more times by $C_1$-$C_{25}$alkyl, $C_1$-$C_8$alkoxy, halogen or cyano;

$Ar^1$ and $Ar^2$ are each independently

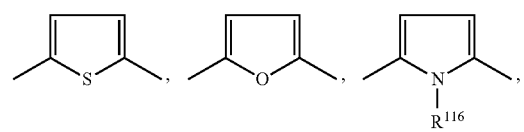

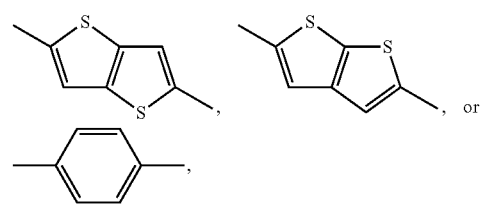

B is a group of formula III, which is different from A,
D is Ar¹,

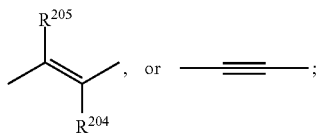
, or

R²⁰⁴ and R²⁰⁵ are each independently H, CN, COOR²⁰⁶ or C₁-C₈alkyl;
R²⁰⁶ is a C₁-C₁₈alkyl group;
E is a group of formula

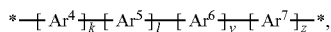

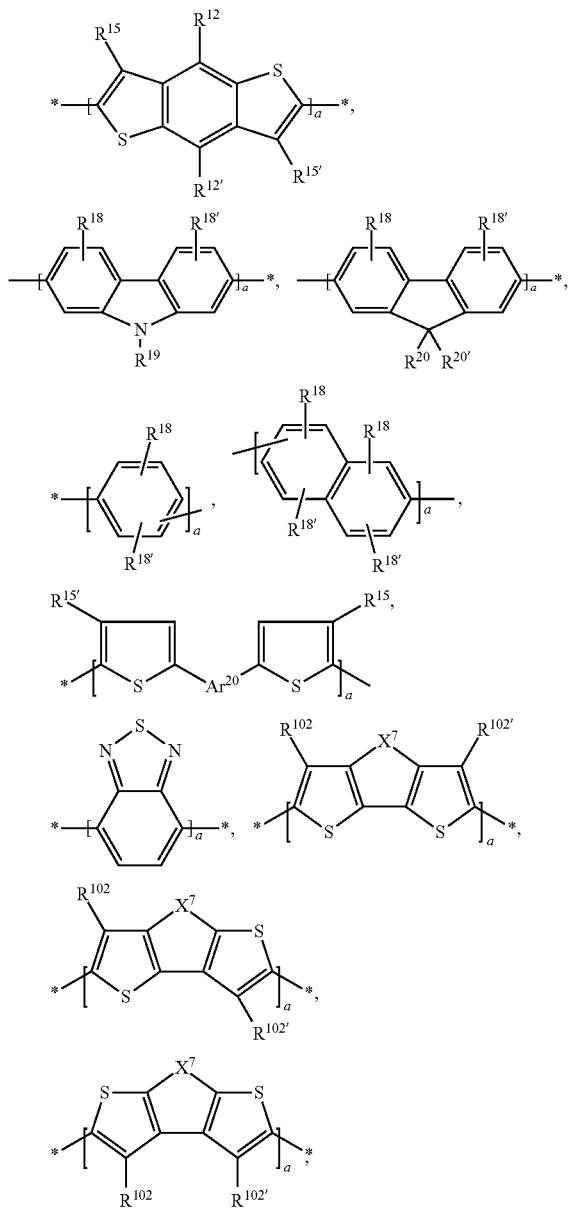

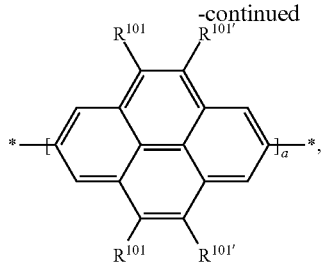

which is different from D, wherein
k is 1,
l is 0, or 1,
v is 0, or 1,
z is 0, or 1,
a is an integer of 1 to 5,
Ar⁴, Ar⁵, Ar⁶ and Ar⁷ are each independently a group of formula

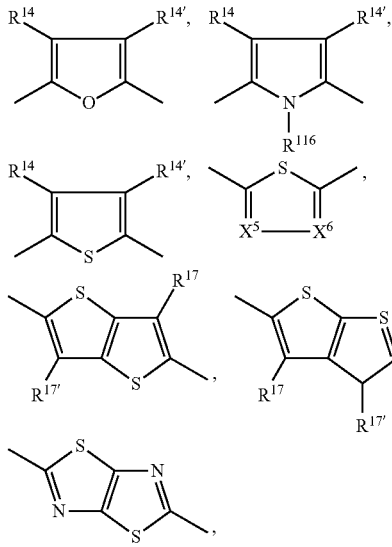

wherein one of X⁵ and X⁶ is N and the other is CR¹⁴,
Ar²⁰ is an arylene group, or a heteroarylene group, each of which are optionally substituted,
R¹² and R¹²' are each independently hydrogen, halogen, C₁-C₂₅alkyl, optionally interrupted by one, or more oxygen or sulphur atoms, C₁-C₂₅alkoxy, C₇-C₂₅arylalkyl, or R¹³,
R¹³ is a C₁-C₈alkyl group, or a tri(C₁-C₈alkyl)silyl group,
R¹⁴, R¹⁴', R¹⁵, R¹⁵', R¹⁷ and R¹⁷' are each independently H, or a C₁-C₂₅alkyl group, optionally interrupted by one or more oxygen atoms;
R¹⁸ and R¹⁸' are each independently hydrogen, halogen, C₁-C₂₅alkyl, optionally interrupted by one or more oxygen or sulphur atoms, C₇-C₂₅aralkyl, or C₁-C₂₅alkoxy;
R¹⁹ is hydrogen, C₇-C₂₅aralkyl, C₆-C₁₈aryl; C₆-C₁₈aryl substituted by C₁-C₁₈alkyl, or C₁-C₁₈alkoxy; or C₁-C₂₅alkyl, optionally interrupted by one or more oxygen or sulphur atoms;
R²⁰ and R²⁰' are each independently hydrogen, C₇-C₂₅aralkyl, C₁-C₂₅alkyl, optionally interrupted by one or more oxygen or sulphur atoms, $X^{11'}$ is independently in each occurrence Cl, Br, or I,
$X^{11}$ is independently in each occurrence —B(OH)$_2$, —B(OY$^1$)$_2$,

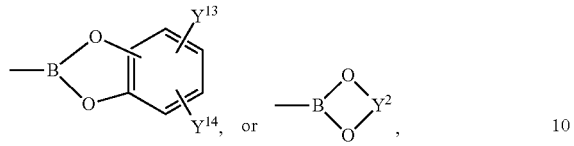

wherein $Y^1$ is independently in each occurrence a $C_1$-$C_{10}$alkyl group and $Y^2$ is independently in each occurrence a $C_2$-$C_{10}$alkylene group, and $Y^{13}$ and $Y^{14}$ are each independently hydrogen, or a $C_1$-$C_{10}$alkyl group.

16. An organic semiconductor device comprising the organic semiconductor material, layer, or component of claim 9.

17. A photovoltaic device, a photodiode, or an organic field transistor comprising the organic semiconductor material, layer or component of claim 9.

* * * * *